(12) United States Patent
Wu

(10) Patent No.: US 10,374,010 B2
(45) Date of Patent: Aug. 6, 2019

(54) PHASE CHANGE MEMORY STRUCTURE AND MANUFACTURING METHOD FOR THE SAME

(71) Applicant: TAIWAN SEMICONDUCTOR MANUFACTURING COMPANY LTD., Hsinchu (TW)

(72) Inventor: Jau-Yi Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/792,370

(22) Filed: Oct. 24, 2017

(65) Prior Publication Data

US 2019/0123103 A1    Apr. 25, 2019

(51) Int. Cl.
| H01L 47/00 | (2006.01) |
| H01L 27/24 | (2006.01) |
| G11C 13/00 | (2006.01) |
| H01L 45/00 | (2006.01) |

(52) U.S. Cl.
CPC ...... *H01L 27/2436* (2013.01); *G11C 13/0004* (2013.01); *H01L 45/126* (2013.01); *H01L 45/144* (2013.01); *H01L 45/148* (2013.01)

(58) Field of Classification Search
CPC . H01L 27/2436; H01L 45/126; H01L 45/144; H01L 45/148; G11C 13/0004
See application file for complete search history.

(56) References Cited

U.S. PATENT DOCUMENTS

| 2008/0061341 A1* | 3/2008 | Lung | G11C 11/5678 |
| | | | 257/303 |
| 2009/0026432 A1* | 1/2009 | Liu | H01L 45/06 |
| | | | 257/2 |

* cited by examiner

*Primary Examiner* — Victor A Mandala
*Assistant Examiner* — Colleen E Snow
(74) *Attorney, Agent, or Firm* — WPAT, P.C., Intellectual Property Attorneys; Anthony King

(57) ABSTRACT

Present disclosure provides a phase change memory structure, including a transistor region, a phase change material over the transistor region, a heater over the transistor region and in contact with the phase change material, and a dielectric layer surrounding the heater and the phase change material. The heater includes a first material having a first thermal conductivity, the first material disposed at a periphery of the heater, and a second material having a second thermal conductivity greater than the first thermal conductivity, the second material disposed at a center of the heater. Present disclosure also provides a method for manufacturing the phase change memory structure described herein.

20 Claims, 22 Drawing Sheets

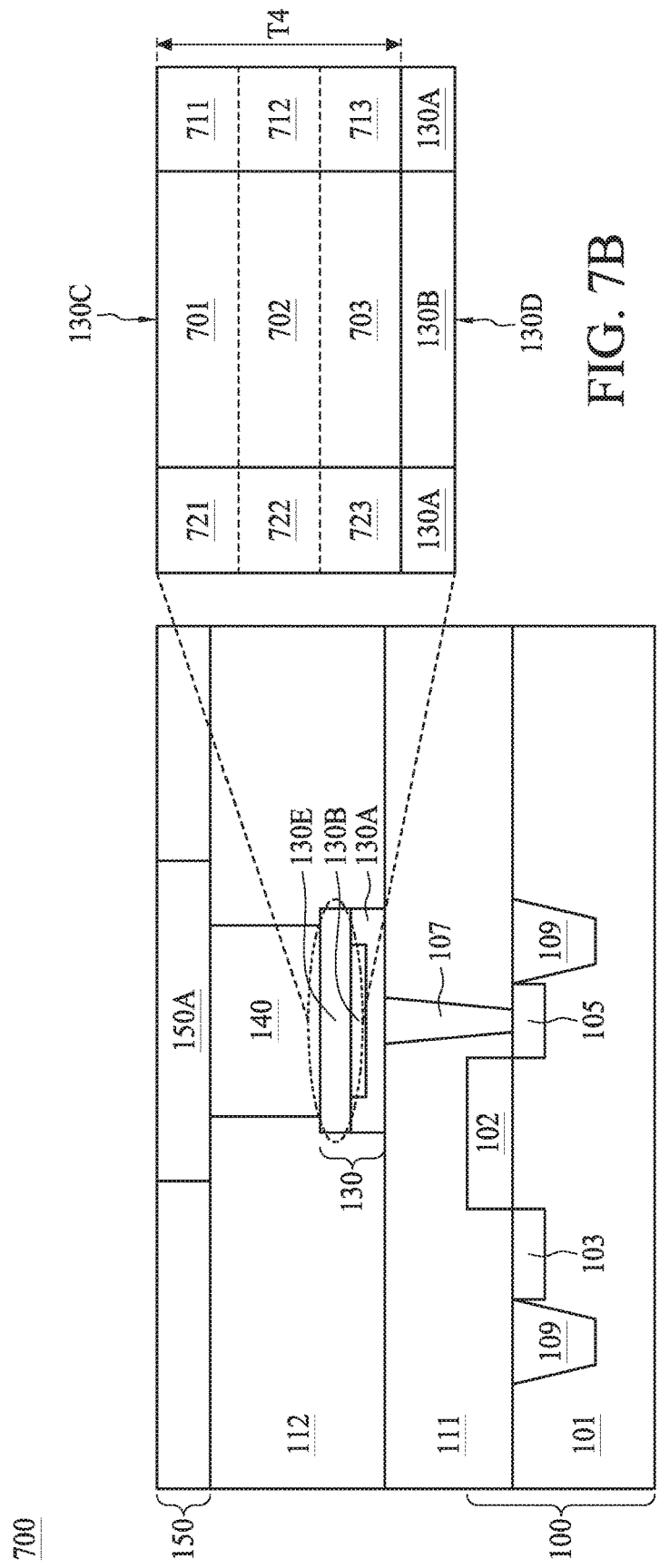

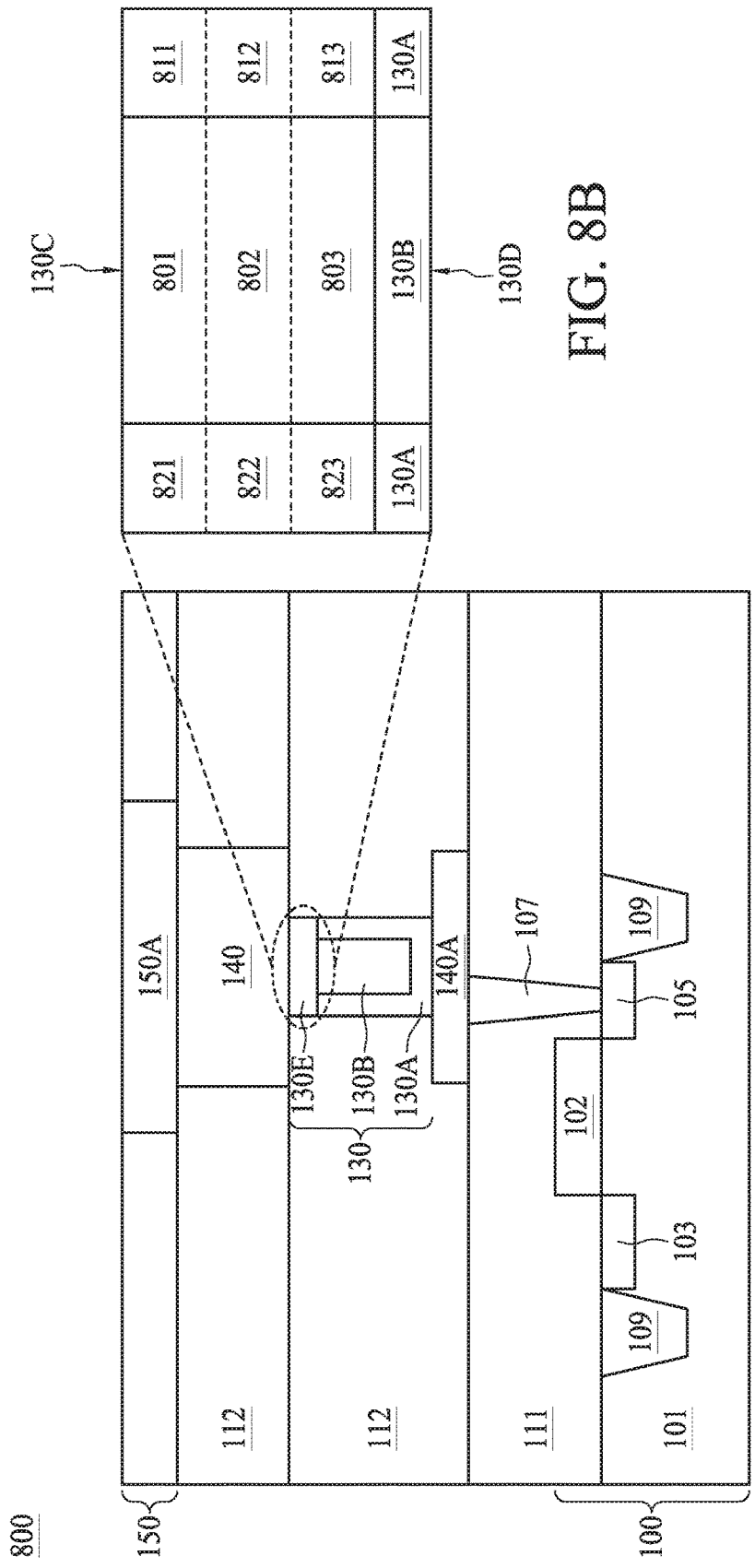

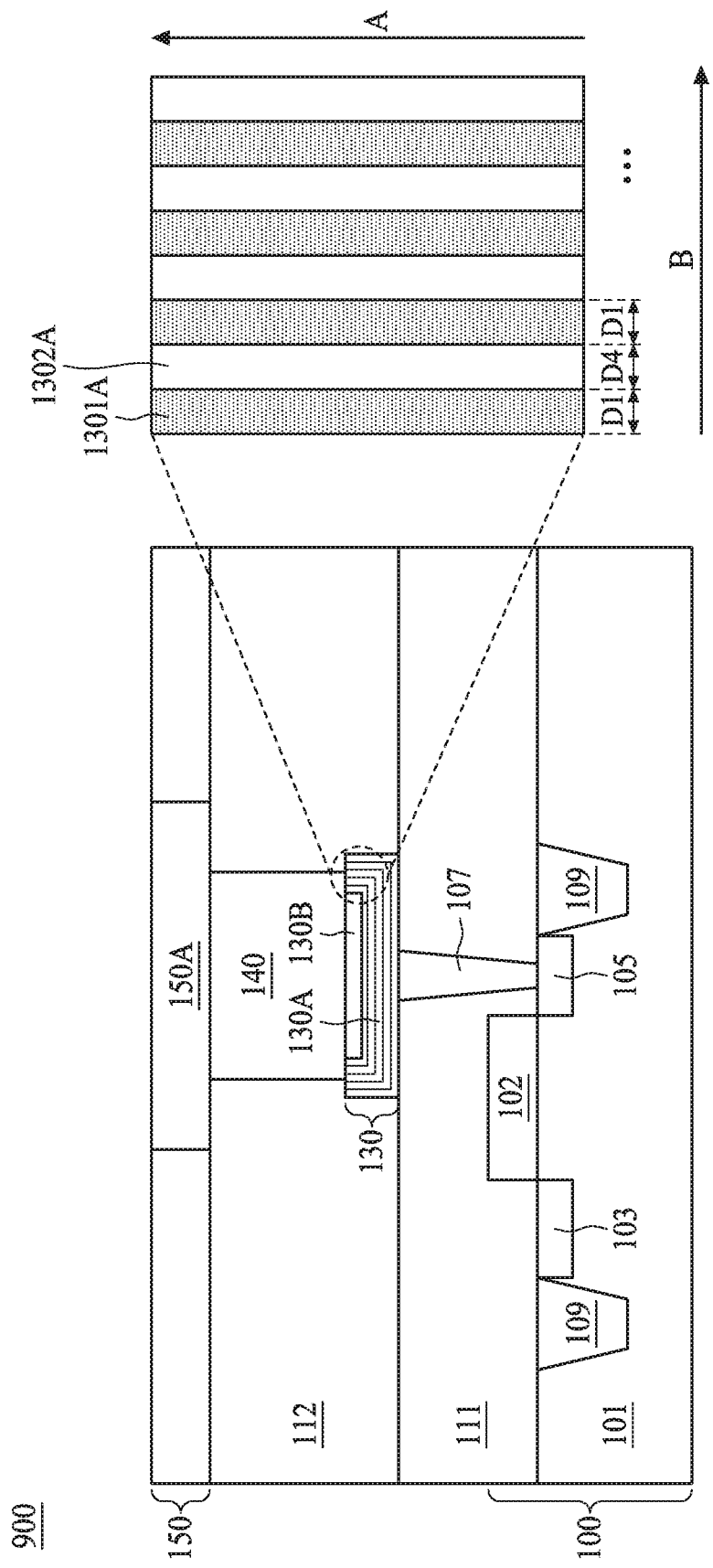

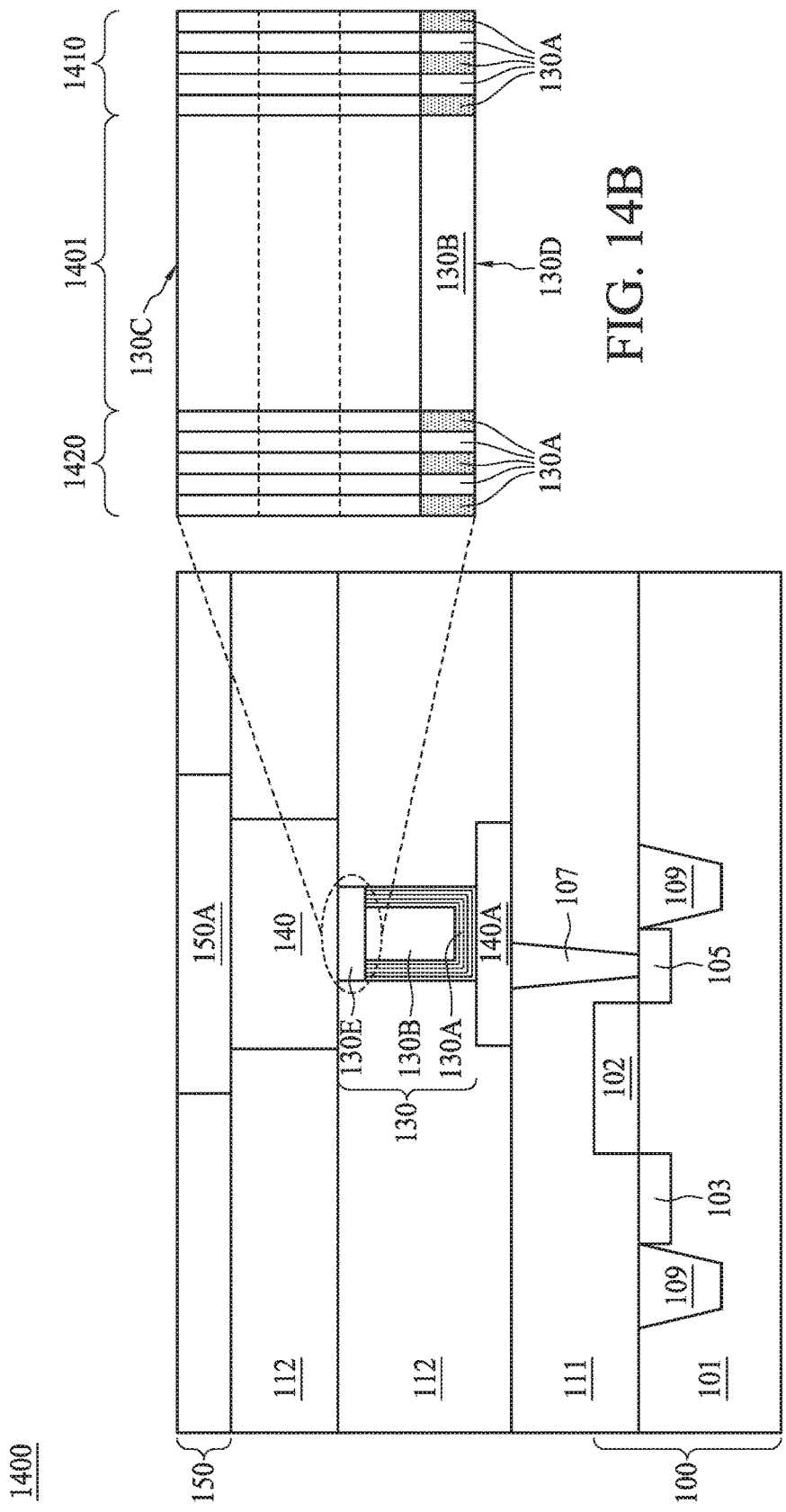

PHASE CHANGE MEMORY STRUCTURE AND MANUFACTURING METHOD FOR THE SAME

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1000 and thus the phase change memory devices are unlikely to have erroneous reading. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PCRAM).

PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells.

Phase change material is formed between top electrode and bottom electrode contact. In a reset operation, phase change material may be heated up to a temperature higher than the melting temperature when a current passes through it. The temperature is then quickly dropped below the crystallization temperature. A portion of the phase change material is changed to an amorphous state with a high resistivity, thus the state of the PCRAM cell is changed to a high-resistance state. Region can be set back to the crystalline state by heating up the phase change material to a temperature higher than the crystallization temperature, but below the melting temperature, for a certain period.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 7A is a cross sectional view showing a phase change memory structure, in accordance with some embodiments of the present disclosure.

FIG. 7B is a partial enlarged cross sectional view of Claim 7A, in accordance with some embodiments of the present disclosure.

FIG. 8A is a cross sectional view showing a phase change memory structure, in accordance with some embodiments of the present disclosure.

FIG. 8B is a partial enlarged cross sectional view of Claim 8A, in accordance with some embodiments of the present disclosure.

FIG. 9A is a cross sectional view showing a phase change memory structure, in accordance with some embodiments of the present disclosure.

FIG. 9B is a partial enlarged cross sectional view of Claim 9A, in accordance with some embodiments of the present disclosure.

FIG. 14A is a cross sectional view showing a phase change memory structure, in accordance with some embodiments of the present disclosure.

FIG. 14B is a partial enlarged cross sectional view of Claim 14A, in accordance with some embodiments of the present disclosure.

DETAILED DESCRIPTION OF THE DISCLOSURE

Figure 1:
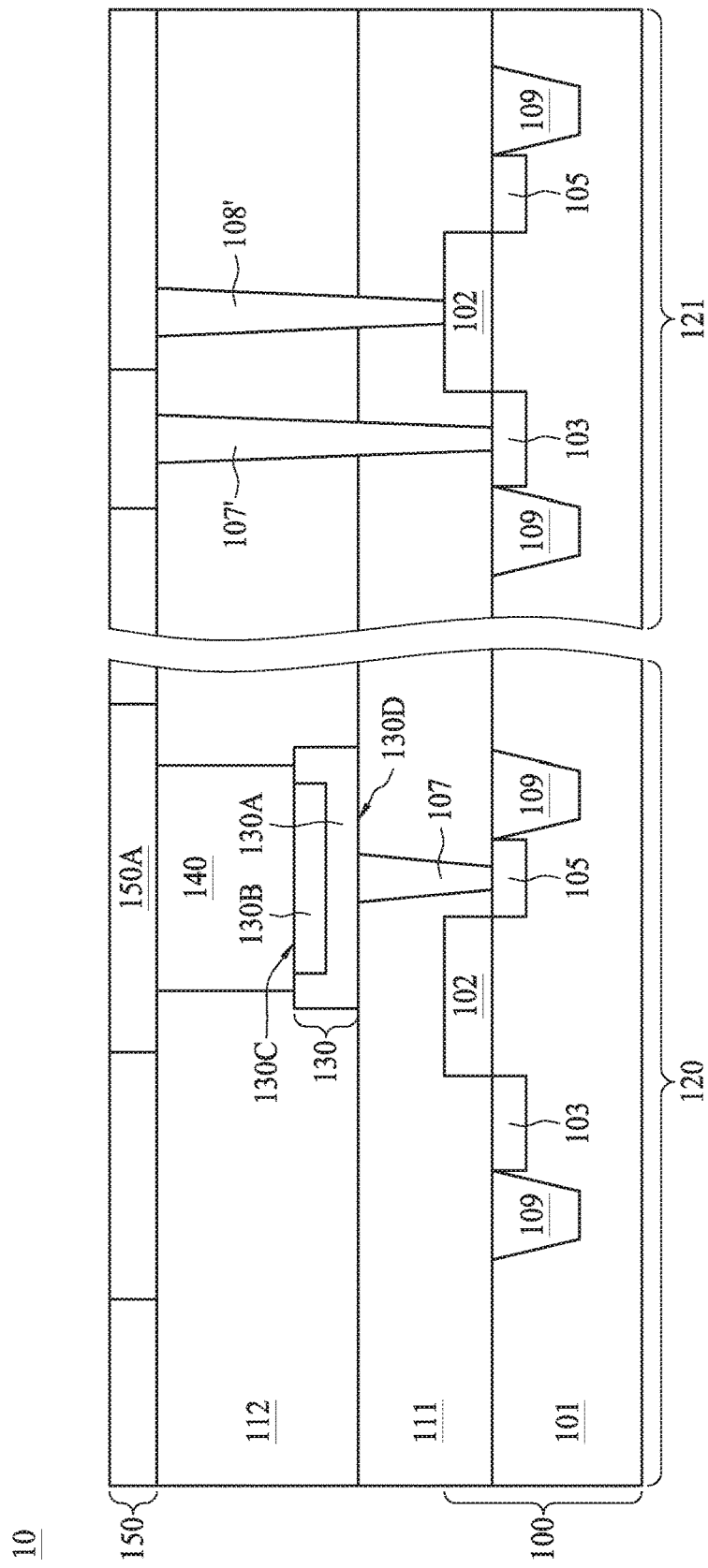
FIG. 1 is a cross sectional view showing a semiconductor structure, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Thermal dissipation is a key parameter for PCRAM structure design since PCRAM is operated by applying enough current, commonly known as write current, to provide joule heating at the phase change material. The greater thermal dissipation at the element providing joule heating, the greater the write current is required to meet RESET or SET temperature. In the present disclosure, in order to reduce the current required to change the resistance states of the phase change material, the element providing joule heating is designed to have lower thermal dissipation so as to retain the thermal energy more effectively, and hence reduce the level of write current.

In some embodiments, the element provides joule heating is a heater. The heater includes a heat insulation shell and a heat conducting core. With all other elements identical, the PCRAM with the heater described herein achieve RESET or SET temperature when applying a write current of 100 micro-ampere, as opposed to a write current of 200 micro-ampere in a PCRAM with a conventional heater, i.e., not having the heat insulation shell and heat conducting core described herein.

Referring to FIG. 1, FIG. 1 is a cross sectional view showing a semiconductor structure 10, in accordance with some embodiments of the present disclosure. The semiconductor structure 10 includes a semiconductor chip having a memory region 120 and a peripheral region 121. In some embodiments, the memory region 120 is close to a chip center than the peripheral region 121. The memory region 120 includes a transistor region 100, a heater 130 over the transistor region 100, and a phase change material 140 over the heater 130.

In some embodiments, the transistor region 100 includes a substrate 101, a source 103, a drain 105, an STI structure 109 in the substrate, and a gate 102, a contact plug 107 in an inter-layer dielectric (ILD) 111 immediately over the substrate 101. In some embodiments, the substrate 101 may include an epitaxial layer formed on the active side, such as an epitaxial semiconductor layer overlying a bulk semiconductor wafer. In some embodiments, the substrate 101 includes a semiconductor-on-insulator (SOI) structure. For example, the substrate may include a buried oxide (BOX) layer formed by a process such as separation by implanted oxygen (SIMOX). In various embodiments, the substrate 101 includes various p-type doped regions and/or n-type doped regions, such as p-type wells, n-type wells, p-type source/drain features and/or n-type source/drain features, formed by a process such as ion implantation and/or diffusion. The substrate 101 may include other functional features such as a resistor, a capacitor, diode, transistors, such as field effect transistors (FETs). The substrate 101 may include lateral insulation features configured to separate various devices formed on the substrate 101. The substrate 101 may further include a portion of a multilayer interconnection (MLI) structure. The multilayer interconnection structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 101. The multilayer interconnection structure is designed to couple various devices features (such as various p-type and n-type doped regions, gate electrodes and/or passive devices) to form a functional circuit.

In some embodiments, the transistor region 100 includes heavily doped regions such as a source 103 and a drain 105 at least partially in the semiconductor substrate 101. A gate 102 is positioned over a top surface of the semiconductor substrate 101 and between the source 103 and the drain 105 to jointly form a transistor structure 121. FIG. 1 shows planar transistors having a doped region in the semiconductor substrate 101. However, the present disclosure is not limited thereto. Any non-planar transistor, such as a FinFET structure, can have raised doped regions. Contact plugs 107 may be formed in a bottom inter-layer dielectric (ILD) 111 adjoined to the top surface of the semiconductor substrate 101, and may be electrically coupled to the transistor region 100. The bottom ILD 111 above the semiconductor substrate 101 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

In many instances, shallow trench insulation (STI) structures 109 are provided to define and electrically isolate adjacent transistors. The STI structures 109 are formed in the semiconductor substrate 101.

In many instances, a phase change random access memory (PCRAM) structure, including at least a phase change material, a bottom electrode and a top electrode of the phase change material 149, is embedded in the metallization layer prepared in a back-end-of-line (BEOL) operation, whereas the transistor region 100 is prepared in a front-end-of-line (FEOL) operation. The PCRAM structure may be embedded in any position of the metallization layer over the transistor region 100, for example, between adjacent metal layers or any of the two metal layers distributed horizontally parallel to a surface of the semiconductor substrate 101. Throughout the description, the term "metal layer" refers to the collection of the metal lines in the same layer. On the other hand, the embedded PCRAM structure can be located between the contact plug 107 and the first metal layer 150. The number provided for the metal layer herein is not limiting. In general, people having ordinary skill in the art can understand that the PCRAM can be located between an $N^{th}$ metal layer and an $(N+1)^{th}$ metal layer, or between an $N^{th}$ metal layer and an $(N+2)^{th}$ metal layer, or between an $N^{th}$ metal layer and an $(N+M)^{th}$ metal layer, where N and M are integers greater than or equal to 1. In an embodiment, $N^{th}$ metal layer includes metal lines surrounded by dielectric layer. Metal lines may be formed using well-known single damascene process, and may be formed of copper or copper alloys such as AlCu, although other metallic material may also be used.

As shown in FIG. 1, the heater 130 functions as a bottom electrode to the phase change material 140, and the metal line 150A of the first metal layer 150 functions as a top electrode of the phase change material 140. In this embodiment, the heater 130 or the bottom electrode is in contact with the contact plug 107 for accessing source 103 or drain 105. The contact plug 107 is surrounded by the bottom ILD 111, and a bottom of the heater 130 or the bottom electrode is in contact with the bottom ILD 111. The formation of contact plug 107 may include forming openings in bottom ILD 111, filling the openings, and then performing a chemical mechanical polish (CMP). Gate contact plug electrically connects gate 102 from overlying metal lines and vias (not shown). For simplicity, the gate contact plug for accessing gate 102 is not shown, although it is also formed simultaneously with contact plug 107. Contact plug 107 may be formed of tungsten (W), although other conductive materials such as silver, aluminum (Al), copper (Cu), AlCu, and the like may also be used or added. Middle ILD 112 over the bottom ILD 111 surrounds the heater 130 or the bottom electrode and the phase change material 140. In the peripheral region 121 of FIG. 1, the contact plug 107' accessing source 103 or drain 105 and the contact plug 108' accessing the gate 102 penetrates through the bottom ILD 111 and the middle ILD 112.

The phase change material 140 includes commonly used chalcogenide materials including, but not limited to, one or more of Ge, Te, and Sb, e.g., which may be GeSbTe, NGeSbTe, InGeSbTe, or stoichiometric materials thereof.

In FIG. 1, the heater includes a heat isolation shell 130A composed of a first material and a heat conducting core 130B composed of a second material and surrounded by the heat isolation shell 130A. In some embodiments, a first thermal conductivity of the first material is smaller than a second thermal conductivity of the second material. For example, the first material may include TaN, which has a thermal conductivity of 3 W/mK, while the second material may include TiN, which has a thermal conductivity of 20 W/mK. For another example, the first material may include TaN, which has a thermal conductivity of 3 W/mK, while the second material may include Ta, which has a thermal conductivity of 57 W/mK. It is shown that the heater 130 has a first surface 130C in contact with the phase change material 140 and a second surface 130D opposite to the first surface 130C.

In this embodiment, the heat isolation shell 130A encloses a sidewall and a bottom of the heat conducting core 130B, and therefore the first material and the second material are both exposed from the first surface 130C. In other words, the heat conducting core 130B and the heat isolation shell 130A are both in contact with a bottom surface of the phase change material 140 at the first surface 130C. It is shown that the entire heat conducting core 130B is in contact with the phase change material 140 while only a portion of the heat isolation shell 130A is in contact with the phase change material 140. However, the illustration of FIG. 1 is not intended to be limiting regarding the interface between the phase change material 140 and the heat conducting core 130B as well as the heat isolation shell 130A of the heater 130. Other arrangements, such as only the heat conducting core 130B is in contact with the bottom of the phase change material 140, shall be enclosed in the contemplated scope of present disclosure. On the other hands, as shown in FIG. 1, only the first material is exposed at the second surface 130D connecting to the contact plug 107 and the middle ILD 111.

In another embodiment, the heat isolation shell 130A is in contact with only a sidewall of the heat conducting core 130B, and therefore the first material and the second material are both exposed from the first surface 130C. In other words, the heat conducting core 130B and the heat isolation shell 130A are both in contact with the phase change material 140 at the first surface. On the other hands, the first material and the second material are both exposed from the second surface 130D under the scheme that only a sidewall of the heat conducting core 130B is surrounded by the heat isolation shell 130A.

In still another embodiment, the heat isolation shell 130A in contact with only a bottom of the heat conducting core 130B, and therefore only the first material is exposed from the first surface 130C. In other words, only the heat conducting core 130B is in contact with the phase change material 140 at the first surface. On the other hands, only the first material is exposed from the second surface 130D under the scheme that heat isolation shell 130A being in contact with only a bottom of the heat conducting core 130B.

Figure 2:
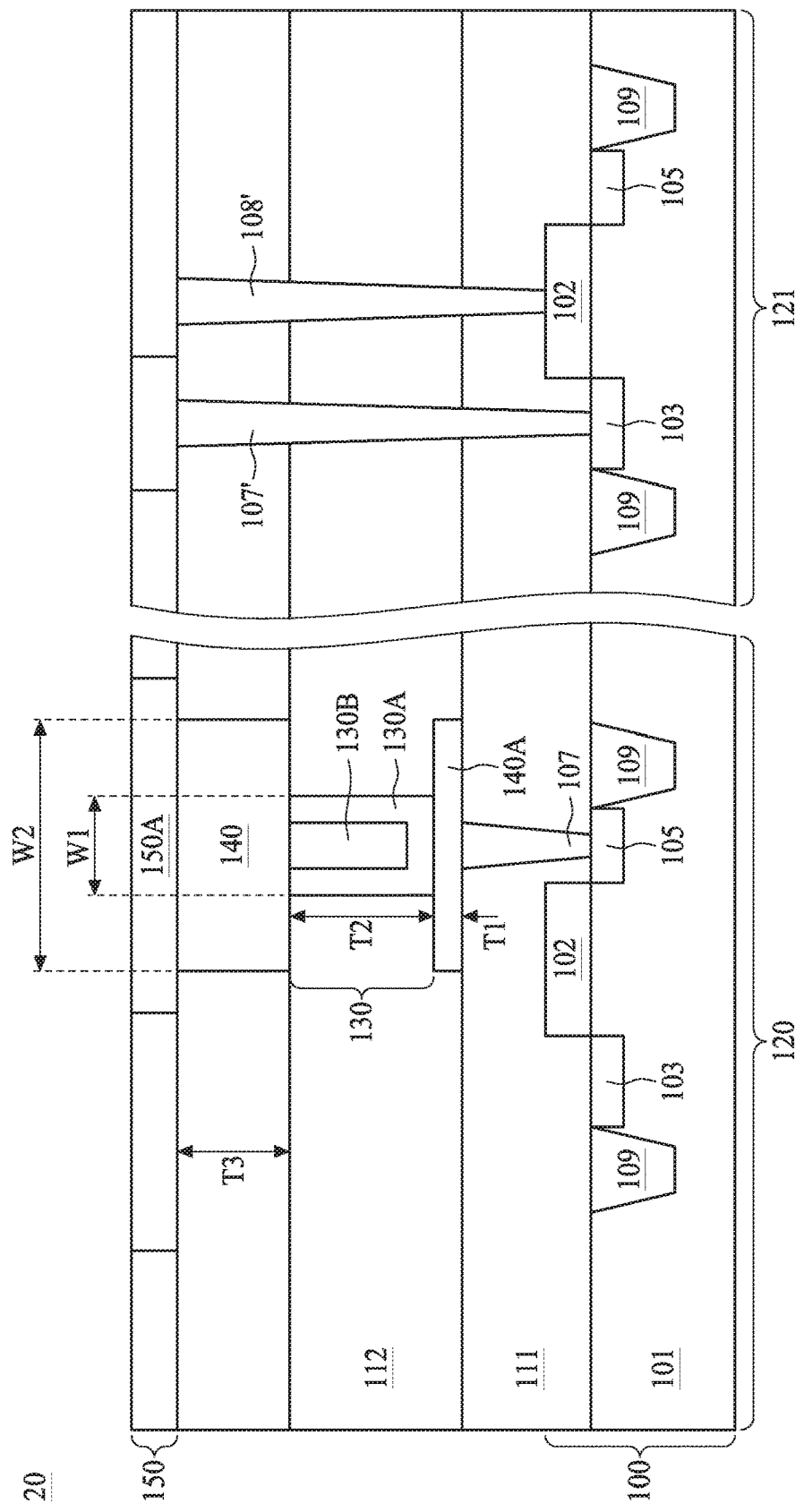
FIG. 2 is a cross sectional view showing a semiconductor structure, in accordance with some embodiments of the present disclosure.

Referring to FIG. 2, FIG. 2 is a cross sectional view showing a semiconductor structure 20, in accordance with some embodiments of the present disclosure. As shown in FIG. 2, the phase change material 140 is connected to a top electrode 150A, which may be a conductive line of the first metal layer 150, and a bottom electrode 140A over the contact plug 107. In some embodiments, bottom electrode 140A is formed of Al, Cu, AlCu, W, or other metallic materials. The formation methods may include commonly used single damascene process, during which middle ILD 112 is formed, followed by forming openings, and filling metallic materials into the openings. A CMP is then performed to remove excess metallic materials, leaving bottom electrode 140A. In alternative embodiments, a blanket metallic material is formed on bottom ILD 111, and is then patterned, leaving bottom electrode 140A. Middle ILD 112 is then filled. The heater 130 is situated between a bottom of the phase change material 140 and the bottom electrode 140A and function as a bottom electrode contact. In some embodiments, the bottom electrode contact is a vertical extension of the bottom electrode in the middle ILD 112 but with smaller occupying footprint than that of the bottom electrode 140A. In some embodiments, a width W1 of heater 130 is smaller than a width W2 of the phase change material 140, therefore only a portion of the phase change material 140 undergoes crystallinity change when applying current. In some embodiments, the width W1 of the heater is about 50 to 60 nanometer according to present technology node. Although not illustrate in proportion, in some embodiments, the bottom electrode 140A has a thickness T1 of from about 100 to 600 Angstrom, the heater has a thickens T2 of from about 50 to about 500 Angstrom, and the phase change material 140 has a thickness T3 of about 300 Angstrom. In some embodiments, the heater 130 may have a thickness essentially equal to or smaller than that of the bottom electrode 140A.

Figure 3:
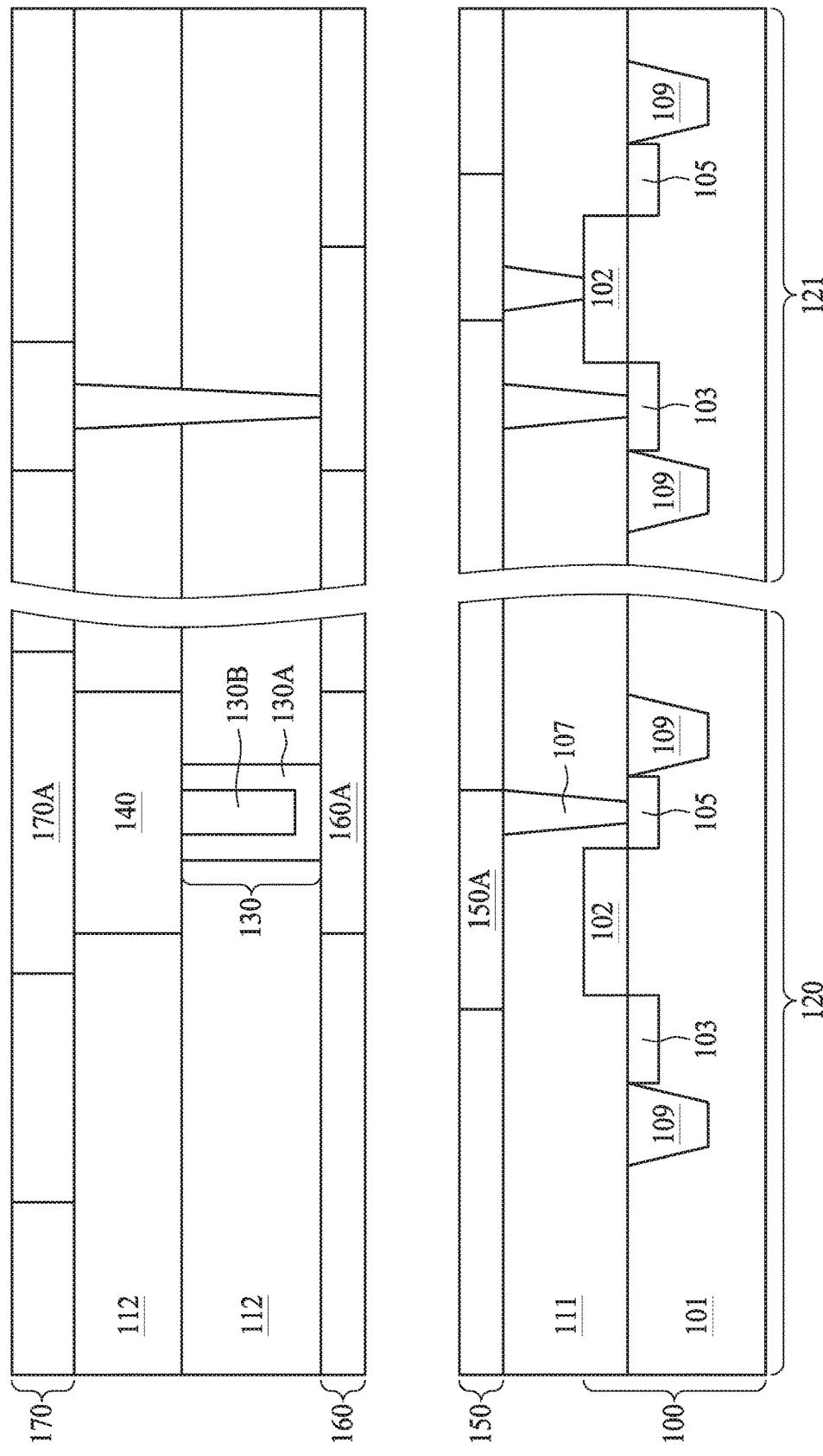
FIG. 3 is a cross sectional view showing a semiconductor structure, in accordance with some embodiments of the present disclosure.

Referring to FIG. 3, FIG. 3 is a cross sectional view showing a semiconductor structure 30, in accordance with some embodiments of the present disclosure. As shown in FIG. 3, the phase change material 140 is connected to a top electrode 170A, which may be a conductive line of the $(N+1)^{th}$ metal layer 170, and a bottom electrode 160A, which may be a conductive line of the $N^{th}$ metal layer 160 over the first metal layer 150. The PCRAM structure, including the phase change material 140, the top electrode 170A, the bottom electrode 160A, and the heater 130 functions as a bottom electrode contact, is previously discussed in FIG. 2 and may be referred thereto. The middle ILD 112 between the $N^{th}$ metal layer 160 and the $(N+1)^{th}$ metal layer 170 surrounds the heater 130 and the phase change material 140.

Figure 4:
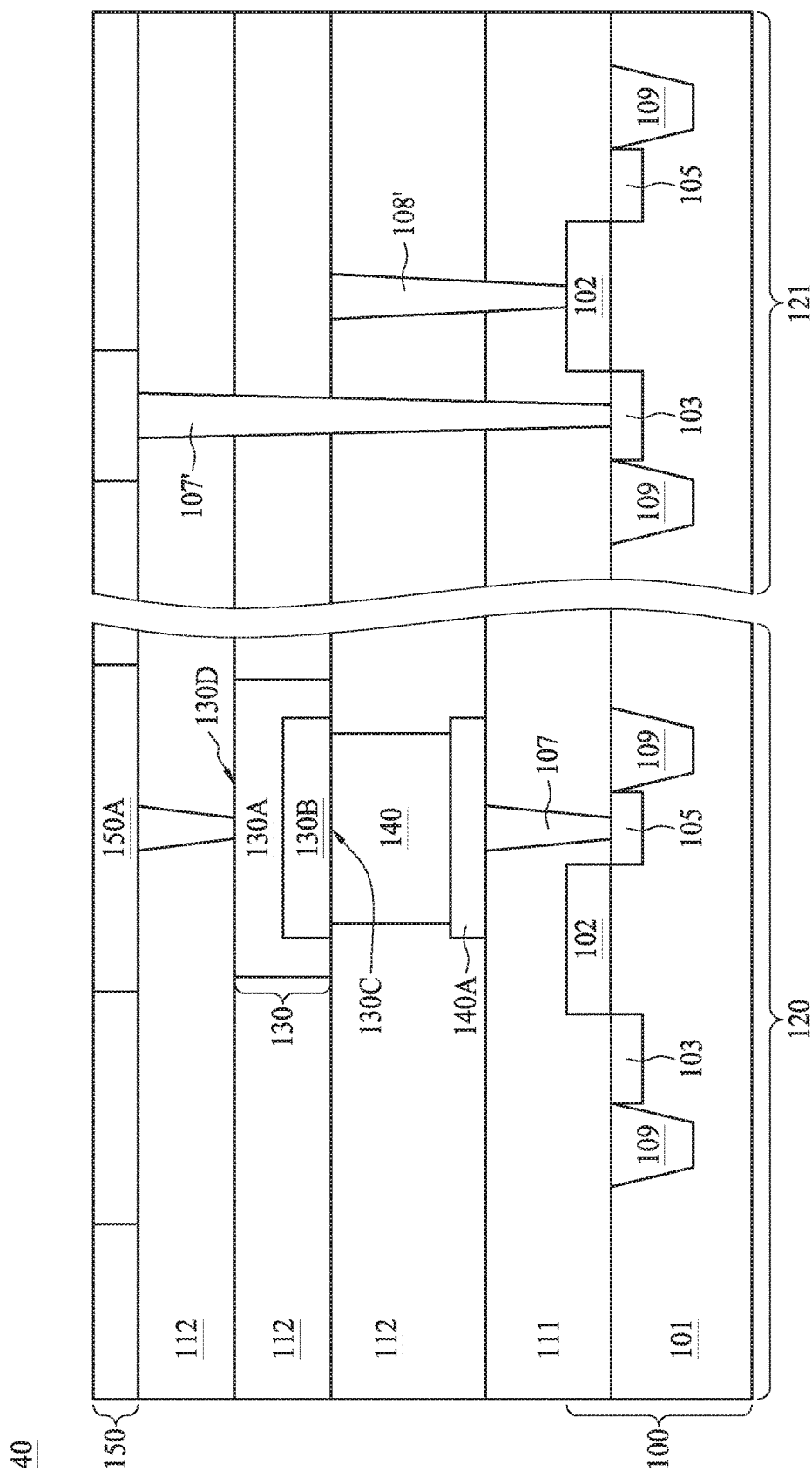
FIG. 4 is a cross sectional view showing a semiconductor structure, in accordance with some embodiments of the present disclosure.

Referring to FIG. 4, FIG. 4 is a cross sectional view showing a semiconductor structure 40, in accordance with some embodiments of the present disclosure. As shown in FIG. 4, the phase change material 140 is connected to a top electrode or a heater 130, which may be conductive pad under the first metal layer 150, and a bottom electrode 140A, which may be a conductive pad over the conductive plug 107. It is shown that the top electrode or the heater 130 has a first surface 130C in contact with a top surface of the phase change material 140 and a second surface 130D opposite to the first surface 130C. In this embodiment, the heat isolation shell 130A encloses a sidewall and a bottom of the heat conducting core 130B, and therefore the first material and the second material are both exposed from the first surface 130C. However, the heat conducting core 130B is wider than the one shown in FIG. 1 and thus only the heat conducing core is in contact with the top surface of the phase change material 140 at the first surface 130C.

Figure 5:
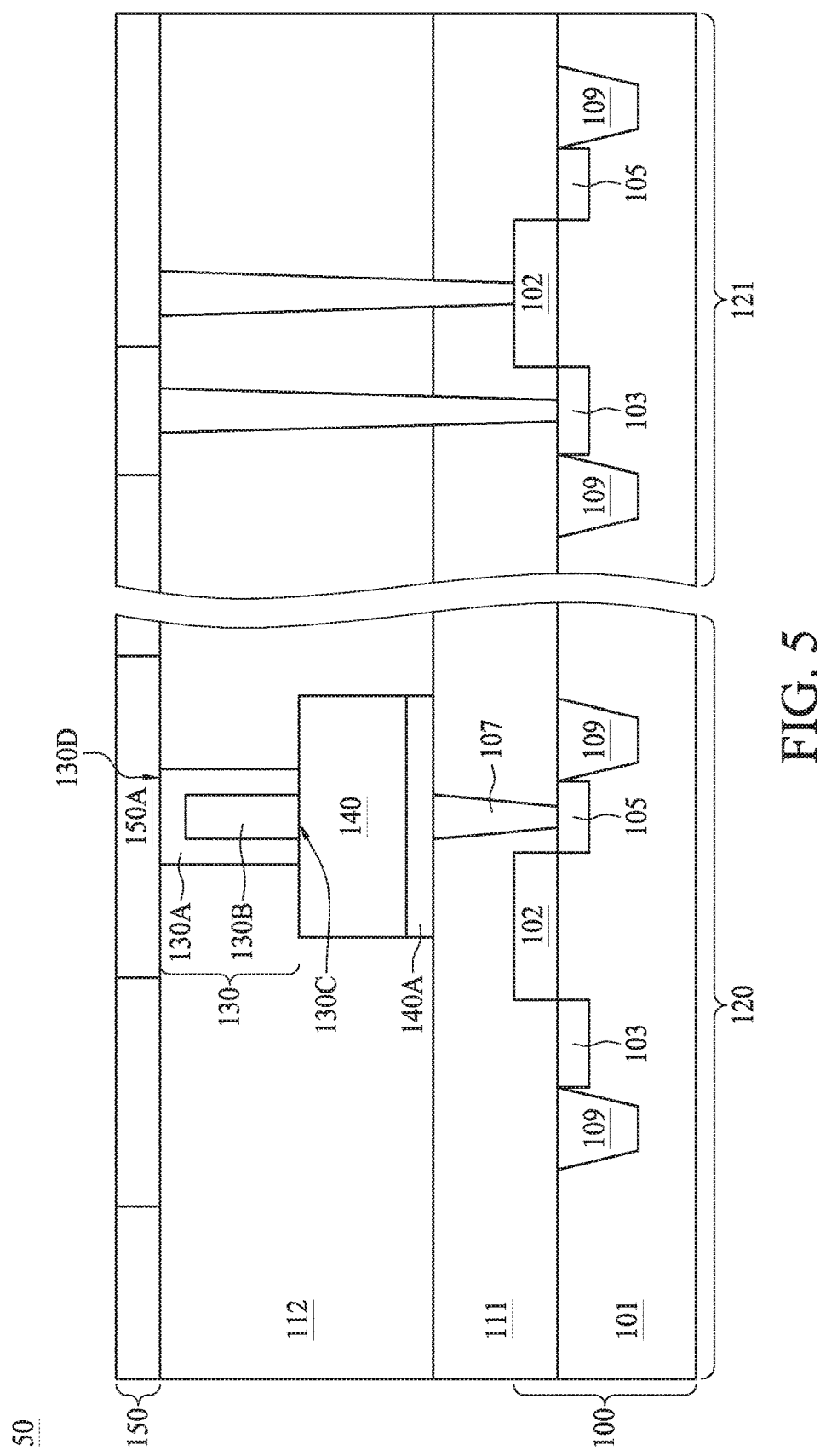
FIG. 5 is a cross sectional view showing a semiconductor structure, in accordance with some embodiments of the present disclosure.

FIG. 5 is a cross sectional view showing a semiconductor structure 50, in accordance with some embodiments of the present disclosure. As shown in FIG. 5, the phase change material 140 is connected to a top electrode, which may be a conductive line 150A in the first metal layer 150, through a top electrode extension or a heater 130, and a bottom electrode 140A, which may be a conductive pad in contact with the contact plug 107 of the transistor region 100. It is shown that the top electrode extension or the heater 130 has a first surface 130C in contact with a top surface of the phase change material 140 and a second surface 130D opposite to the first surface 130C in contact with the top electrode or the conductive line 150A. In this embodiment, the heat isolation shell 130A encloses a sidewall and a bottom of the heat conducting core 130B, and therefore the first material and the second material are both exposed from the first surface 130C. The heat conducting core 130B is in contact with a local portion of the top surface of the phase change material 140 at the first surface 130C.

Figure 6:
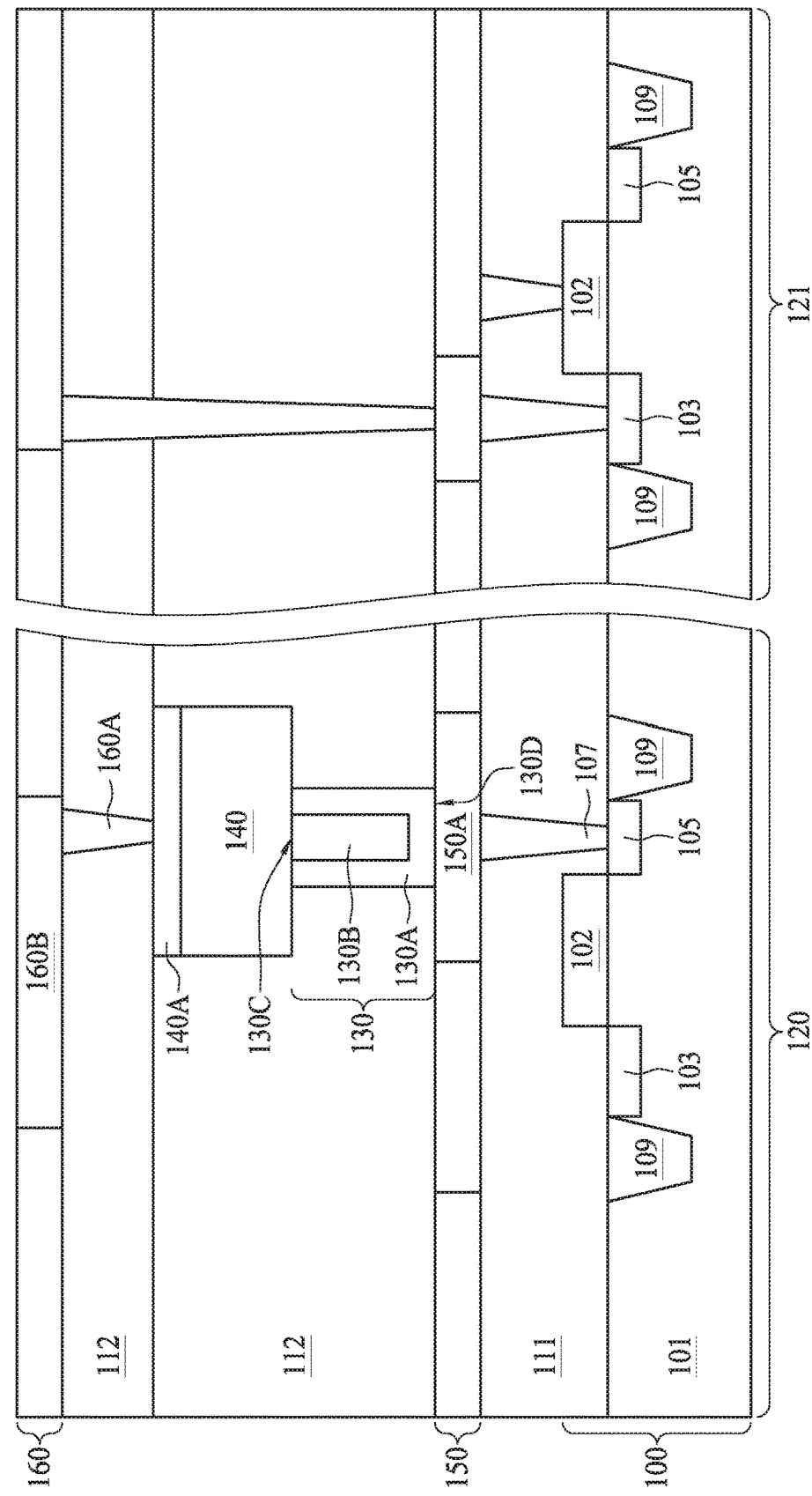
FIG. 6 is a cross sectional view showing a semiconductor structure, in accordance with some embodiments of the present disclosure.

FIG. 6 is a cross sectional view showing a semiconductor structure 60, in accordance with some embodiments of the present disclosure. As shown in FIG. 6, the phase change material 140 is connected to a top electrode, which may be a conductive pad 140A embedded and surrounded by the middle ILD 112, and a bottom electrode, which may be a conductive line 150A of the first metal layer 150, through a bottom electrode contact 130. The top electrode of the conductive pad 140A is further in contact with a via 160A and a metal line 160B of the second metal layer 160. It is shown that the bottom electrode contact 130 has a first surface 130C in contact with a bottom surface of the phase change material 140 and a second surface 130D opposite to the first surface 130C in contact with the bottom electrode or the conductive line 150A. In this embodiment, the heat isolation shell 130A encloses a sidewall and a bottom of the heat conducting core 130B, and therefore the first material and the second material are both exposed from the first surface 130C. The heat conducting core 130B is in contact with a local portion of the bottom surface of the phase change material 140 at the first surface 130C.

FIG. 7A is a cross sectional view showing a phase change memory structure 700, in accordance with some embodiments of the present disclosure. The phase change memory structure 700 is substantially identical to the memory region 120 of the semiconductor structure 10 in FIG. 1 except for an additional heat assisting layer 130E, composed of a third material and having a third thermal conductivity lower than the second thermal conductivity, is disposed at the first surface 130C and in contact with a bottom of the phase change material 140. The heat assisting layer 130E is a portion of the bottom electrode or the heater 130. In some embodiments, the third material may be oxygen derivatives or oxynitride derivatives. For example, the heat assisting layer 130E may include TiO, TiON, TaO, TaON, and the like. In the present disclosure, the third material may be considered as a portion of the heat conducting core 130B or a portion of the heat isolation shell 130A in proximity to the first surface 130C.

In some embodiments, the heat assisting layer 130E is formed by oxidizing the heat conducting core 130B and the heat isolation shell 103A from the first surface 130C, and thereby forming the oxidized first material and oxidized second material. In some embodiments, the oxygen content in the oxidized first material and oxidized second material is decreasing starting from the first surface 130C toward the second surface 130D. For example, as further illustrated in FIG. 7B, graded oxygen stoichiometry may be observed starting from the first surface 130C toward the heat conducting core 130B and the heat isolation shell 130A. In some embodiments, a thickness T4 of the heat assisting layer 130E is from about 1 nm to about 5 nm. In some embodiments, if the heat conducting core 130B is composed of TiN and the heat isolation shell 130A is composed of TaN, the heat assisting layer 130E can be divided into several regions 701, 702, 703, 711, 712, 713, 721, 722, and 723. Region 701 may have a stoichiometry of $TiO_{x3}N_{1-x3}$, region 702 may have a stoichiometry of $TiO_{x2}N_{1-x2}$, and region 703 may have a stoichiometry of $TiO_{x1}N_{1-x1}$, in which x3 is greater than x2, and x2 is greater than x1. Similarly, region 711 may have a stoichiometry of $TaO_{y3}N_{1-y3}$, region 712 may have a stoichiometry of $TaO_{y2}N_{1-y2}$, and region 713 may have a stoichiometry of $TaO_{y1}N_{1-y1}$, in which y3 is greater than y2, and y2 is greater than y1. In some embodiments, regions 721, 722, 723 may follow the stoichiometry of regions 711, 712, 713. Note the regions may not be evenly spaced but rather follow the diffusion curve of the oxygen applied in the oxygen plasma or rapid thermal annealing. In some embodiments, the oxygen stoichiometry may be continuously changing or the oxygen content continuously decreasing along the downward direction and a region with finite thickness having a fixed oxygen stoichiometry may not be identified.

FIG. 8A is a cross sectional view showing a phase change memory structure, 800 in accordance with some embodiments of the present disclosure. The phase change memory structure 800 is substantially identical to the memory region 120 of the semiconductor structure 20 in FIG. 2 except for an additional heat assisting layer 130E, composed of a third material and having a third thermal conductivity lower than the second thermal conductivity, is disposed at the first surface 130C and in contact with a bottom of the phase change material 140. The heat assisting layer 130E is a portion of the bottom electrode contact or the heater 130. In some embodiments, the third material may be oxygen derivatives or oxynitride derivatives. For example, the heat assisting layer 130E may include TiO, TiON, TaO, TaON, and the like. In the present disclosure, the third material may be considered as a portion of the heat conducting core 130B or a portion of the heat isolation shell 130A in proximity to the first surface 130C.

As further illustrated in FIG. 8B, graded oxygen stoichiometry may be observed starting from the first surface 130C toward the heat conducting core 130B and the heat isolation shell 130A. In some embodiments, if the heat conducting core 130B is composed of Ta and the heat isolation shell 130A is composed of TaN, the heat assisting layer 130E can be divided into several regions 801, 802, 803, 811, 812, 813, 821, 822, and 823. Region 801 may have a stoichiometry of $TaO_{x3}$, region 802 may have a stoichiometry of $TaO_{x2}$, and region 803 may have a stoichiometry of $TaO_{x1}$, in which x3 is greater than x2, and x2 is greater than x1. Alternatively stated, $TaO_{x2}$ can be more oxygen deficient than $TaO_{x3}$, and $TaO_{x1}$ can be more oxygen deficient than $TaO_{x2}$. Similarly, region 811 may have a stoichiometry of $TaO_{y3}N_{1-y3}$, region 812 may have a stoichiometry of $TaO_{y2}N_{1-y2}$, and region 813 may have a stoichiometry of $TaO_{y1}N_{1-y1}$, in which y3 is greater than y2, and y2 is greater than y1. In some embodiments, regions 821, 822, 823 may follow the stoichiometry of regions 811, 812, 813.

FIG. 9A is a cross sectional view showing a phase change memory structure 900, in accordance with some embodiments of the present disclosure. The phase change memory structure 900 is substantially identical to the memory region 120 of the semiconductor structure 10 in FIG. 1 except for the layering structure of the heat isolation shell 130A. In some embodiments, the heat isolation shell 130A includes a superlattice structure. The superlattice structure is a portion of the bottom electrode or the heater 130. Superlattice structures, in general, are known and typically comprise a composite made of alternating ultrathin layers of different materials. By the appropriate choice of materials, a superlattice having a heat conduction structure and other characteristics can be produced. In accordance with the present invention, a superlattice structure includes m monolayers of a first material alternating with n monolayers of a fourth material with a pair of monolayers defining a superlattice period and each of the materials having a relatively smooth interface therebetween. In the present disclosure, a monolayer of material includes a single, closely packed layer of atoms of such material. For example, a TiN monolayer includes a single, closely packed layer of titanium and nitrogen atoms arranged in a preferred unit cell structure. The fourth material having a fourth thermal conductivity. The fourth thermal conductivity may be greater than or smaller than the second thermal conductivity of the second material because the low dimension of superlattice structure rendering material property of bulk material not the only determination factor for thermal conductivity design.

The thermal transport by phonons, however, can also be controlled through the proper design of the superlattice unit cell. The superlattice thermal conductivity tensor is anisotropic, with the in-plane thermal conductivity often being several factors greater than the cross-plane value. This characteristic may lead to the use of superlattices in directional heat transfer applications where a material that can simultaneously insulate in one direction and channel heat in another is desired. As shown in FIG. 9A, the portion of heat isolation shell 130A at a side of the heat conducting core 130B is enlarged in FIG. 9B. In this embodiment, a layer 1301A of first material and a layer 1302A of a fourth material form one superlattice period. As shown in FIG. 9B, 4 superlattice periods composed of alternating first material and fourth material are shown. A layer thickness D1 of the first material may be equal to a layer thickness D4 of the fourth material. In some embodiments, D1 and D4 are both 1 nanometer. However, D1 and D4 may not be equally thick. As discussed previously, the thermal conductivity in the in-plane direction A may be several factors greater than that in the cross-plane direction B. In other words, the heat generated in the heat conducting core 103B is harder to dissipate to the surrounding, for example, the middle ILD 112, via the superlattice structure of the heat isolation shell 130A along the cross-plane direction.

In one embodiment, when only one period of alternating first material and fourth material is in the heat isolation shell 130A, the fourth thermal conductivity may be smaller than the second thermal conductivity. For example, the first material may be TaN, having a thermal conductivity of 3 W/mK, the second material may be Ta, having a thermal conductivity of 57 W/mK, and the fourth material may be TiN, having a thermal conductivity of 20 W/mK.

Figure 10B:
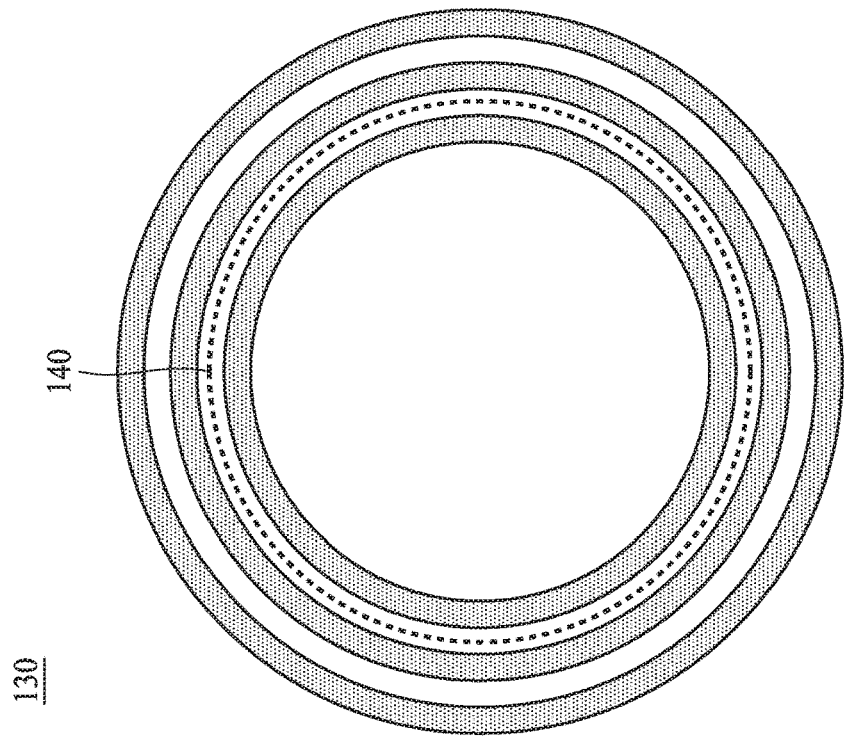
FIG. 10B is a top view showing relative shapes of a heater and a phase change material, in accordance with some embodiments of the present disclosure.
Figure 10A:
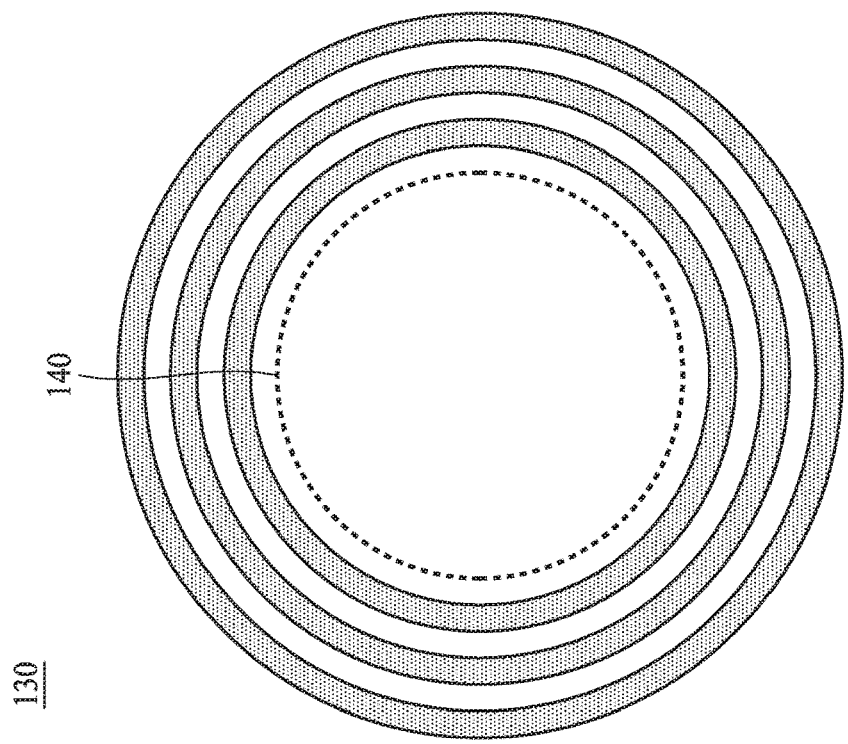
FIG. 10A is a top view showing relative shapes of a heater and a phase change material, in accordance with some embodiments of the present disclosure.

FIG. 10A and FIG. 10B are top views showing relative shapes of a heater 130 and a phase change material 140, in accordance with some embodiments of the present disclosure. In FIG. 10A, a footprint of the phase change material 140 only lands on the heat conducting core 130B, whereas in FIG. 10B, a footprint of the phase change material 140 lands on both the heat conducting core 130B and the heat isolation shell 130A.

Figures 11A, 11B:
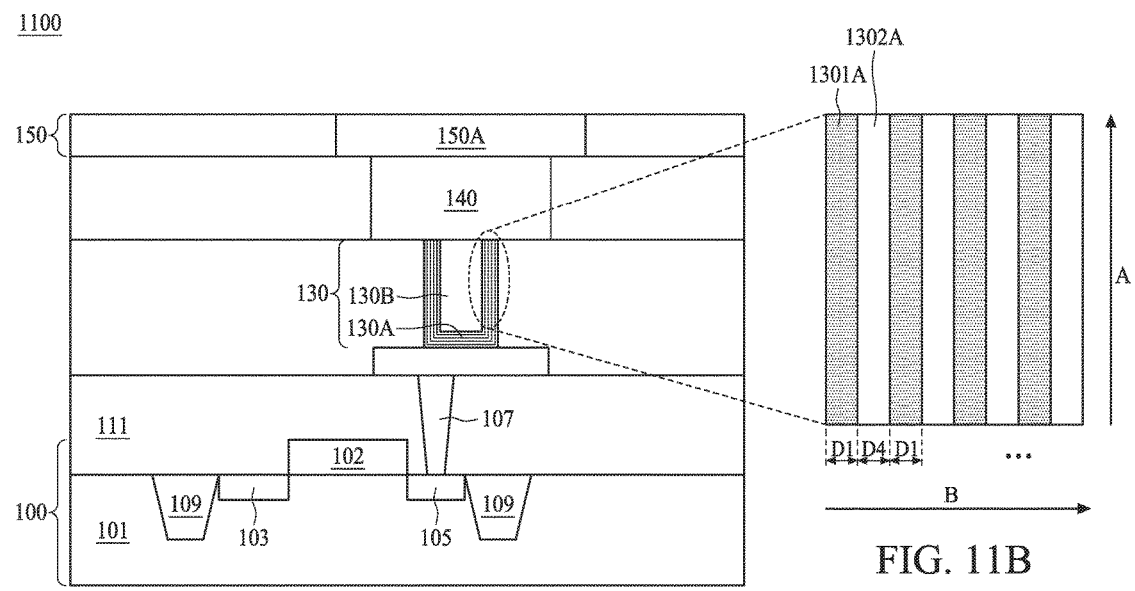
FIG. 11A is a cross sectional view showing a phase change memory structure, in accordance with some embodiments of the present disclosure.
FIG. 11B is a partial enlarged cross sectional view of Claim 11A, in accordance with some embodiments of the present disclosure.

FIG. 11A is a cross sectional view showing a phase change memory structure 1100, in accordance with some embodiments of the present disclosure. The phase change memory structure 1100 is substantially identical to the memory region 120 of the semiconductor structure 20 in FIG. 2 except for the layering structure of the heat isolation shell 130A. In some embodiments, the heat isolation shell 130A includes a superlattice structure. The superlattice structure is a portion of the bottom electrode contact or the heater 130. As shown in FIG. 11A, the portion of heat isolation shell 130A at a side of the heat conducting core 130B is enlarged in FIG. 11B. In this embodiment, a layer 1301A of first material and a layer 1302A of a fourth material form one superlattice period. As shown in FIG. 11B, 4 superlattice periods composed of alternating first material and fourth material are shown. A layer thickness D1 of the first material may be equal to a layer thickness D4 of the fourth material. In some embodiments, D1 and D4 are both 1 nanometer. However, D1 and D4 may not be equally thick. As discussed previously, the thermal conductivity in the in-plane direction A may be several factors greater than that in the cross-plane direction B. In other words, the heat generated in the heat conducting core 103B is harder to dissipate to the surrounding, for example, the middle ILD 112, via the superlattice structure of the heat isolation shell 130A along the cross-plane direction.

Figure 12:
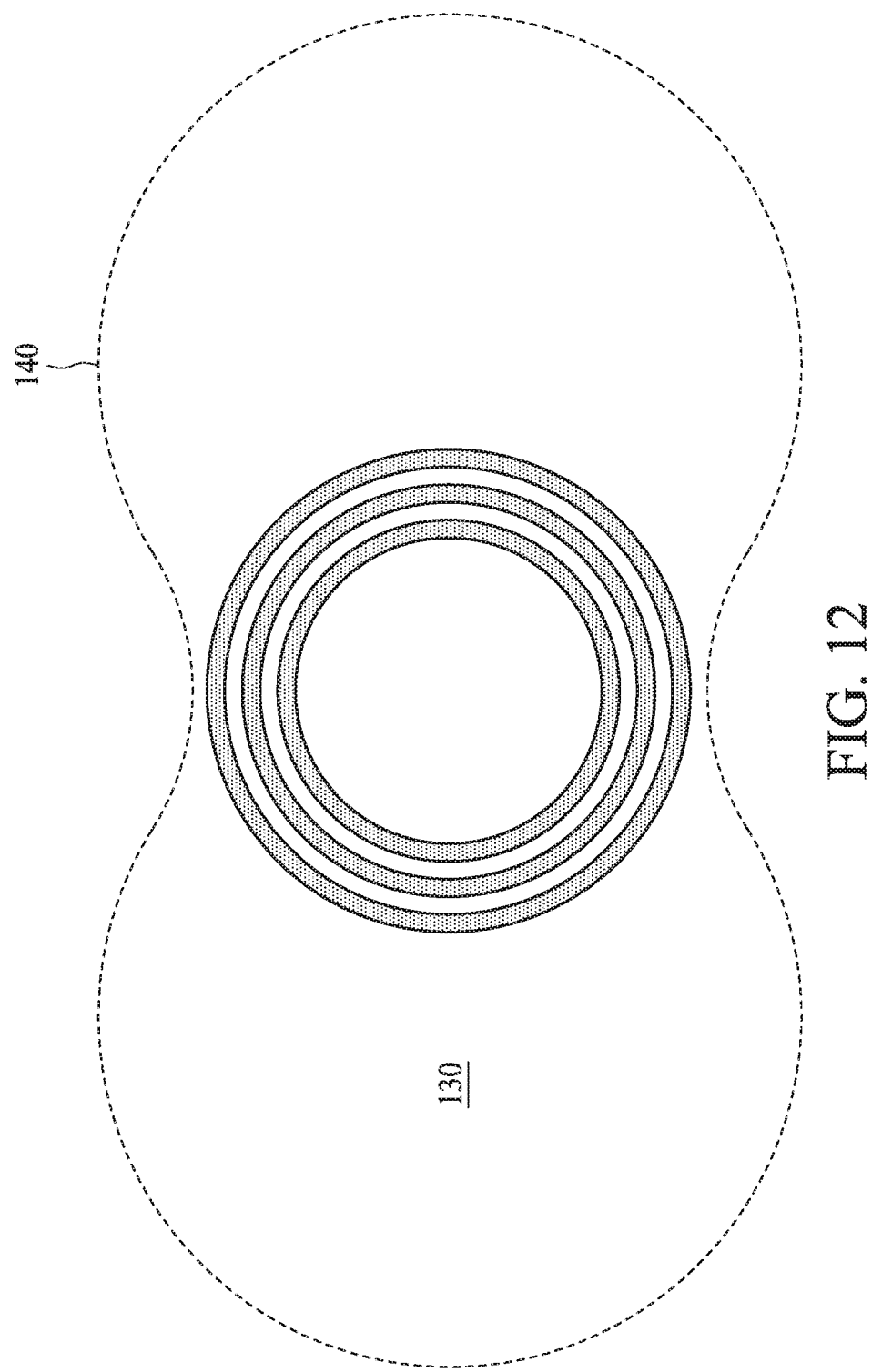
FIG. 12 is a top view showing relative shapes of a heater and a phase change material, in accordance with some embodiments of the present disclosure.

FIG. 12 is a top view showing relative shapes of a heater 130 and a phase change material 140, in accordance with some embodiments of the present disclosure. In FIG. 12, a footprint of the heater 130 lands on a narrowest portion of the footprint of the phase change material 140. Due to the relatively great resistance of narrow portion, the phase change may occur at narrow portion. In other embodiments, the footprint of the phase change material 140 may be a stripe with equal width.

Figures 13A, 13B:
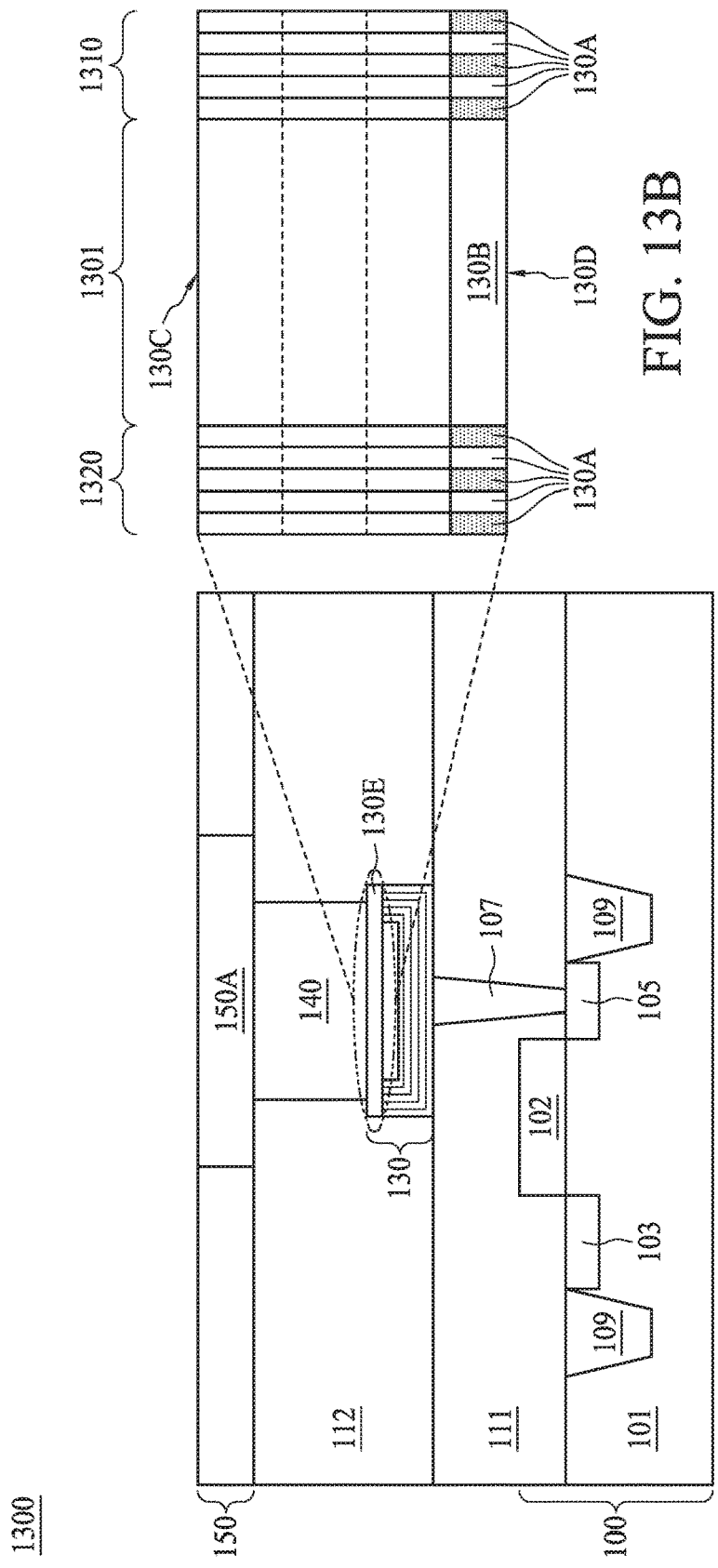
FIG. 13A is a cross sectional view showing a phase change memory structure, in accordance with some embodiments of the present disclosure.
FIG. 13B is a partial enlarged cross sectional view of Claim 13A, in accordance with some embodiments of the present disclosure.

FIG. 13A is a cross sectional view showing a phase change memory structure 1300, in accordance with some embodiments of the present disclosure. The phase change memory structure 1300 is substantially identical to the phase change memory structure 900 in FIG. 9A except for an additional heat assisting layer 130E, composed of a third material and having a third thermal conductivity lower than the second thermal conductivity, is disposed at the first surface 130C and in contact with a bottom of the phase change material 140. The heat assisting layer 130E is a portion of the bottom electrode or the heater 130. In some embodiments, the third material may be oxygen derivatives or oxynitride derivatives. In some embodiments, the heat assisting layer 130E is formed by oxidizing the heat conducting core 130B and the heat isolation shell 103A from the first surface 130C, and thereby forming the oxidized first material and oxidized second material. In some embodiments, the oxygen content in the oxidized first material and oxidized second material is decreasing starting from the first surface 130C toward the second surface 130D. For example, as further illustrated in FIG. 13B, graded oxygen stoichiometry may be observed starting from the first surface 130C toward the heat conducting core 130B and the heat isolation shell 130A. As discussed previously, the graded oxygen stoichiometry of region 1301 may follow regions 701, 702, 703 of FIG. 7B, and the graded oxygen stoichiometry of regions 1310 and 1320 may follow regions 711, 712, 713, and 721, 722, 723, respectively, of FIG. 7B. The reduction trend of oxygen content in different sublayers of the heat assisting layer 130E can be referred to the description of FIG. 7B and is not repeated here for brevity.

FIG. 14A is a cross sectional view showing a phase change memory structure 1400, in accordance with some embodiments of the present disclosure. The phase change memory structure 1400 is substantially identical to the phase change memory structure 1100 in FIG. 11A except for an additional heat assisting layer 130E, composed of a third material and having a third thermal conductivity lower than the second thermal conductivity, is disposed at the first surface 130C and in contact with a bottom of the phase change material 140. The heat assisting layer 130E is a portion of the bottom electrode extension or the heater 130. In some embodiments, the third material may be oxygen derivatives or oxynitride derivatives. In some embodiments, the heat assisting layer 130E is formed by oxidizing the heat conducting core 130B and the heat isolation shell 103A from the first surface 130C, and thereby forming the oxidized first material and oxidized second material. In some embodiments, the oxygen content in the oxidized first material and oxidized second material is decreasing starting from the first surface 130C toward the second surface 130D. For example, as further illustrated in FIG. 14B, graded oxygen stoichiometry may be observed starting from the first surface 130C toward the heat conducting core 130B and the heat isolation shell 130A. As discussed previously, the graded oxygen stoichiometry of region 1401 may follow regions 801, 802, 803 of FIG. 8B, and the graded oxygen stoichiometry of regions 1410 and 1420 may follow regions 811, 812, 813, and 821, 822, 823, respectively, of FIG. 8B. The reduction trend of oxygen content in different sublayers of the heat assisting layer 130E can be referred to the description of FIG. 8B and is not repeated here for brevity.

Figure 15:
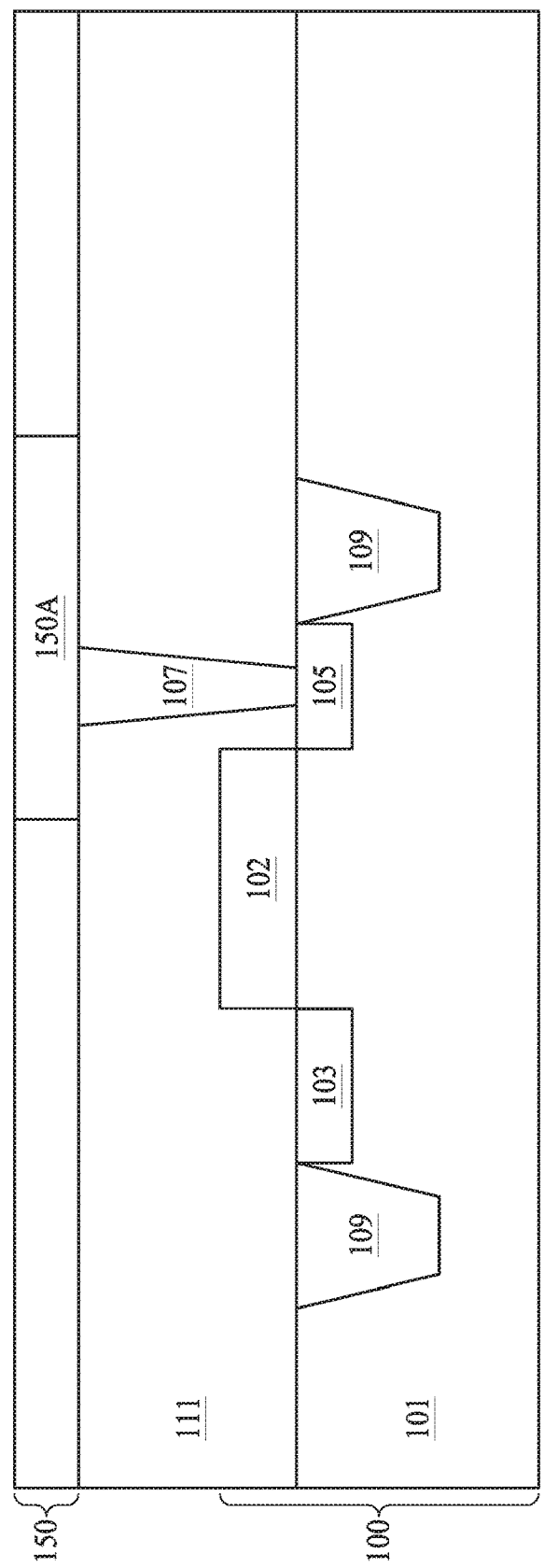
FIGS. 15, 16, 17, 18, 19, 20A, 20B, and 21 are cross sectional views of intermediate product in manufacturing a phase change memory structure, in accordance with some embodiments of the present disclosure.
Figure 16:
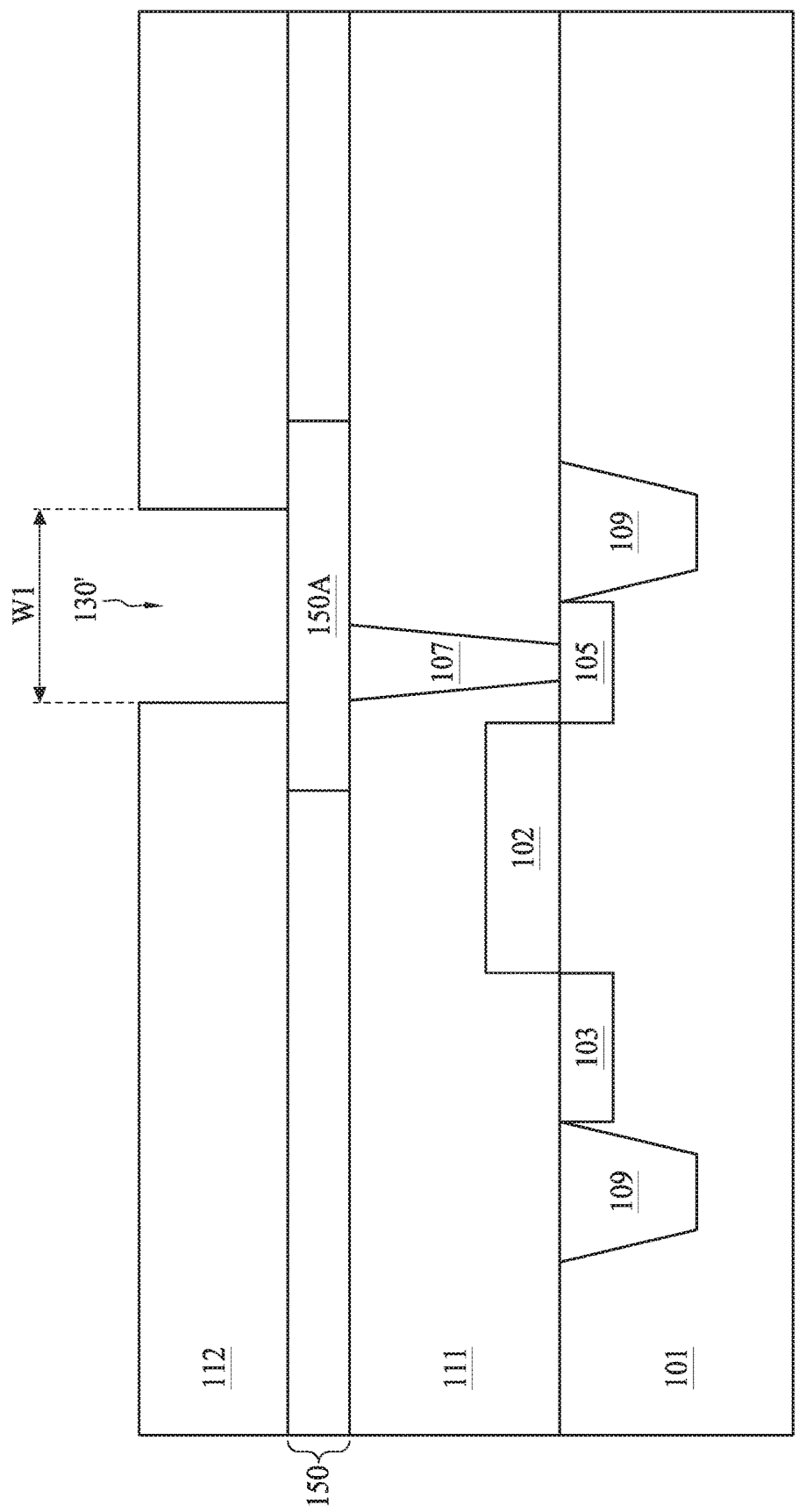

FIGS. 15, 16, 17, 18, 19, 20A, 20B, and 21 are cross sectional views of intermediate product in manufacturing a phase change memory structure, in accordance with some embodiments of the present disclosure. In FIG. 15, a transistor region 100 is formed in a substrate 101 and a bottom ILD 111. A contact plug 107 accessing the drain 105 of the transistor region 100 is surrounded by the bottom ILD 111 and is in contact with the first metal layer 150. Metal lines 150A in the first metal layer 159 may be formed using well-known single damascene process, and may be formed of copper or copper alloys such as AlCu, although other metallic material may also be used. In some embodiments, the metal line 150A of the first metal layer 150 is a bottom electrode for the PCRAM structure. In FIG. 16, middle ILD 112 is formed using a single damascene process. A contact trench 130' is patterned in the middle ILD 112 with a desired width W1. The width W1 is determined based on a width W2 of a phase change material to be subsequently formed. The width W1 can be wider than the width W2 so as to cover the entire phase change material. On the other hand, the width W1 can be narrower than the width W2 so as to contact a local portion of the phase change material.

Figure 17:
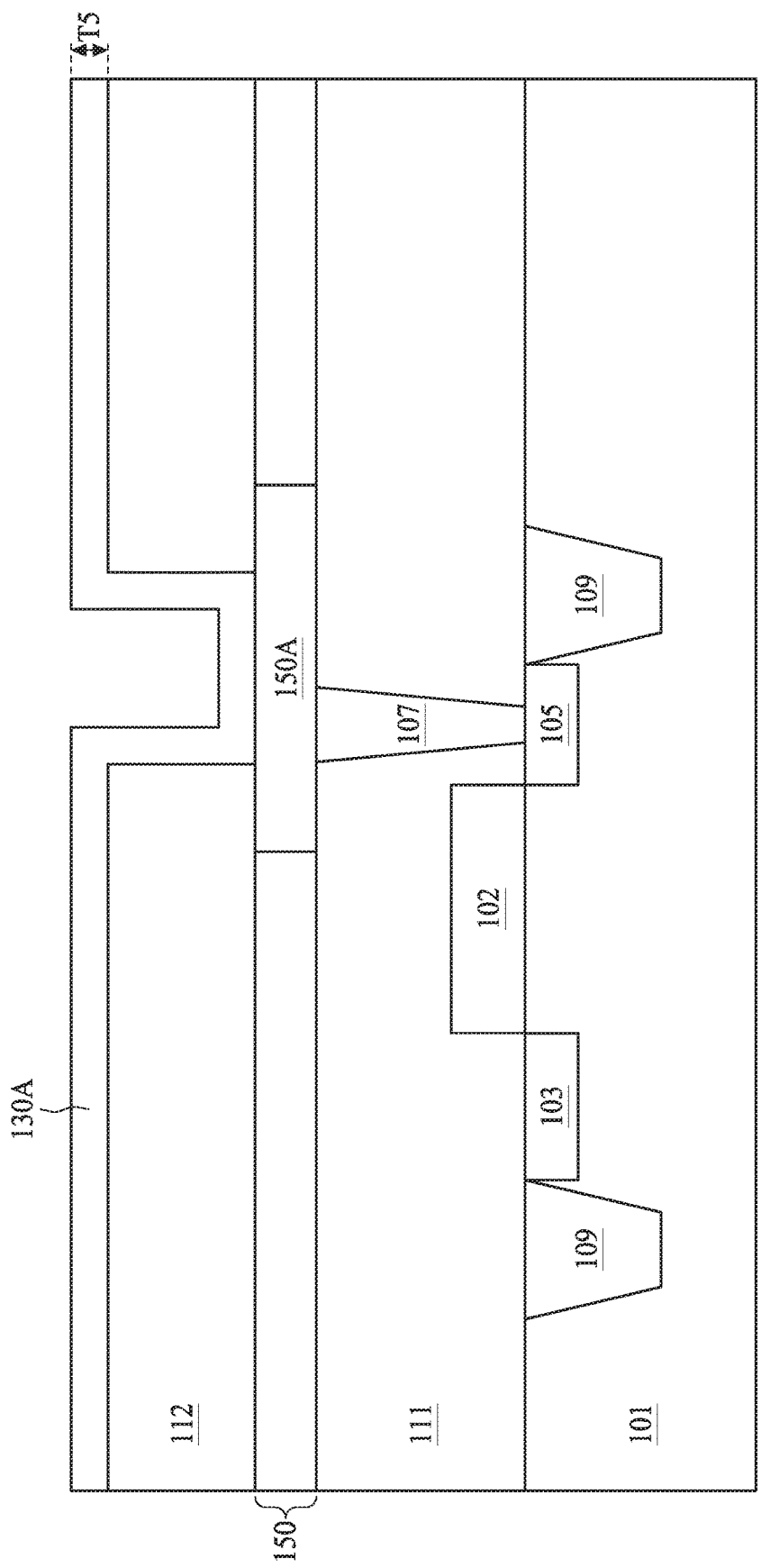
Figure 18:
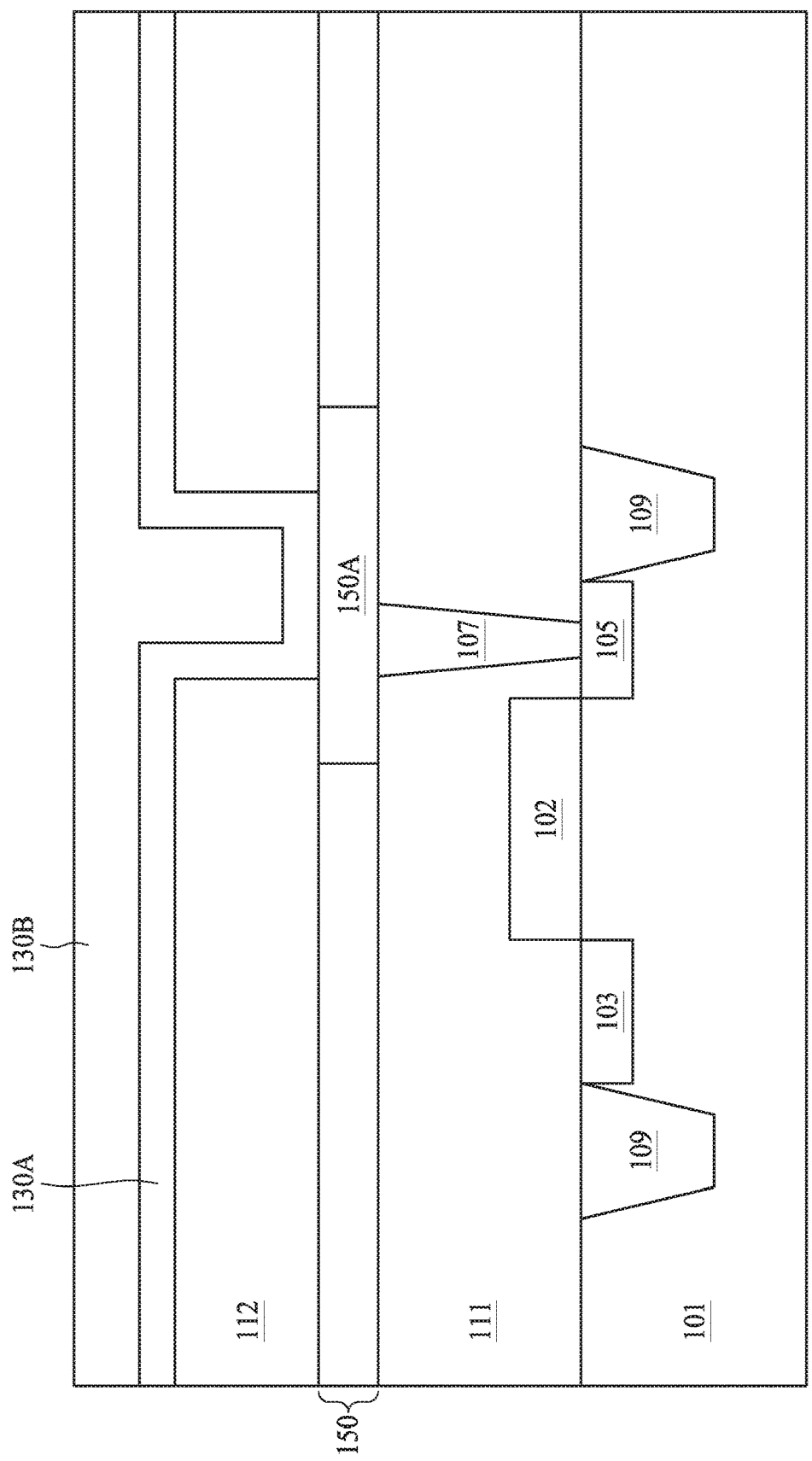
Figure 19:
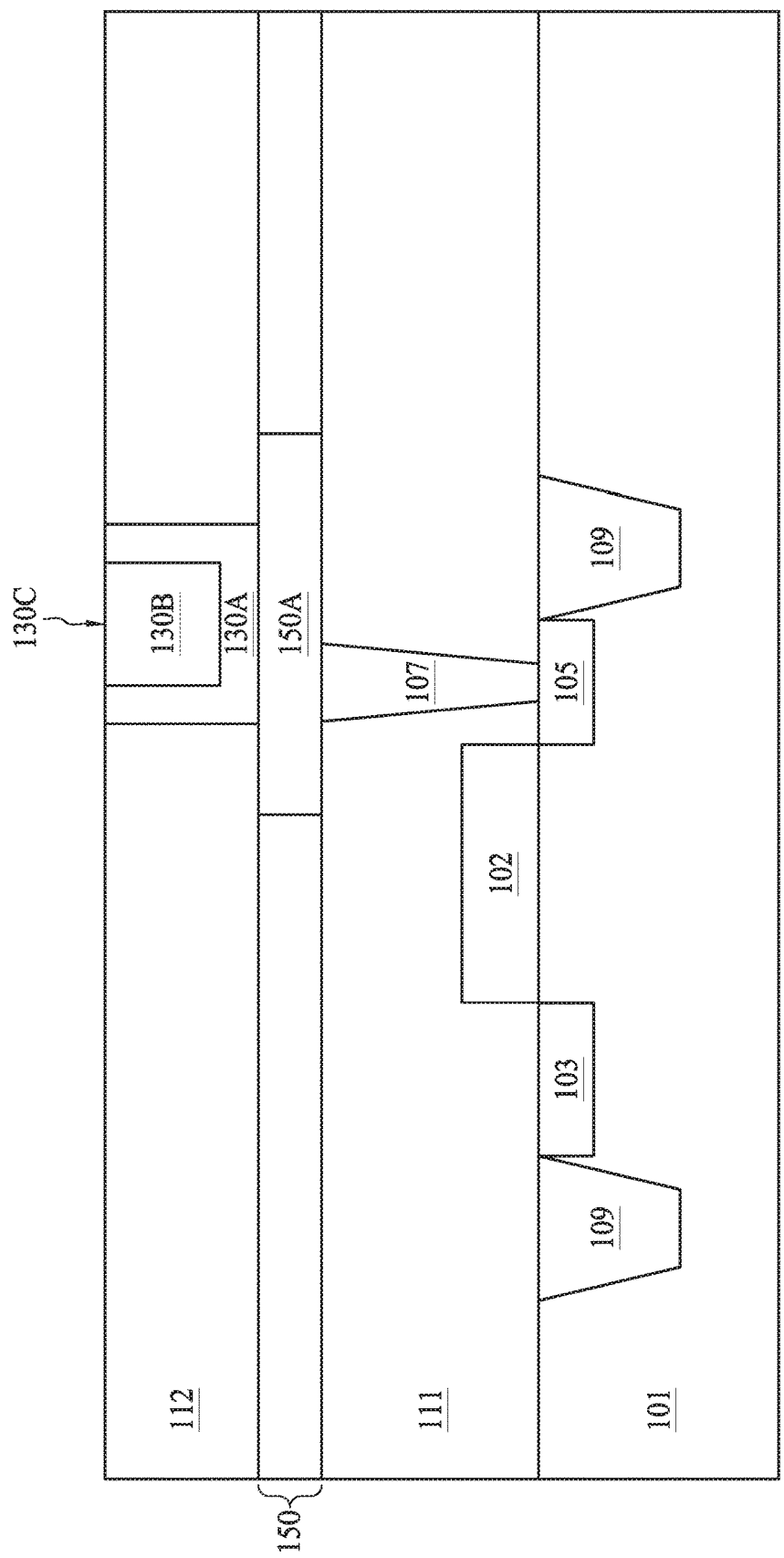

In FIG. 17, a heat insulation shell 130A or a heat insulation layer is conformably deposited in the trench 130' and over the top surface of the middle ILD 112. In some embodiments, the thickness T5 of the heat insulation shell 130A or the heat insulation layer is about 10 to 100 Angstrom. As previously discussed, the heat insulation layer is composed of a first material having a first thermal conductivity. Therefore, only a single layer of first material is deposited using, for example, physical vapor deposition (PVD) or chemical vapor deposition (CVD). In some embodiments, the heat insulation layer is composed of several materials having an effective first thermal conductivity. When the several materials of the heat insulation layer are arranged in an alternating fashion with repetition order, the heat insulation layer includes a superlattice having an effective first thermal conductivity. In this case, a superlattice structure is deposited using, for example, atomic layer deposition (ALD). In FIG. 18, a heat conductive core 130B or a heat conductive material is deposited to fill up the trench 130' and overflow to the top of the middle ILD 112 as well as the heat insulation layer. As previously discussed, the heat conductive material is composed of a second material having a second thermal conductivity greater than the first thermal conductivity. In FIG. 19, the excess heat insulation layer and the heat conductive material are removed from a top of the middle ILD 112 through a planarization operation, for example, a chemical mechanical polishing (CMP), resulting a first surface 130C simultaneously exposing the heat conducting core 130B, the heat isolation shell 130A, and the middle ILD 112. In other words, the first surface 130C is a coplanar surface for the heat conducting core 130B, the heat isolation shell 130A, and the middle ILD 112.

Figure 20A:
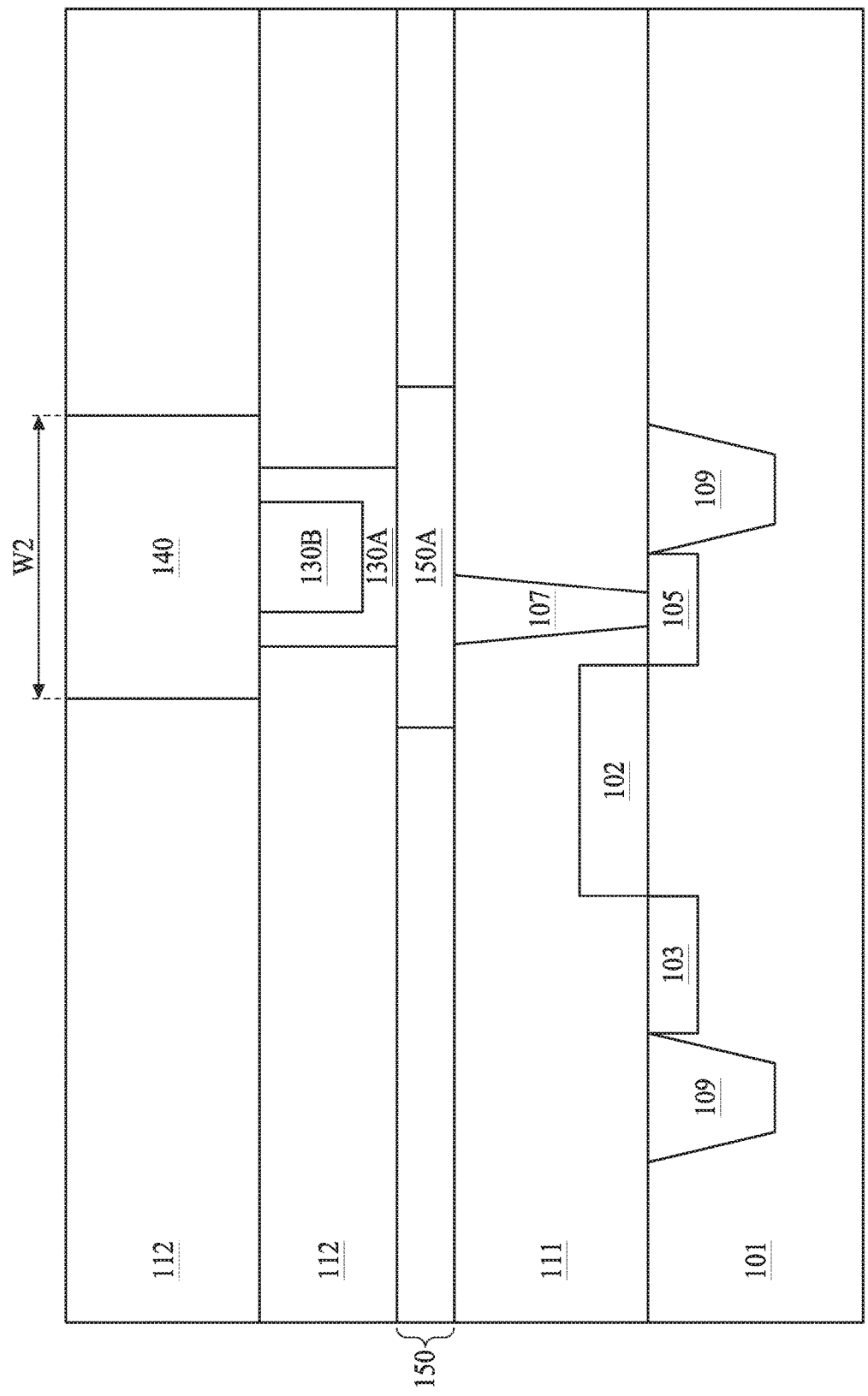
Figure 20B:
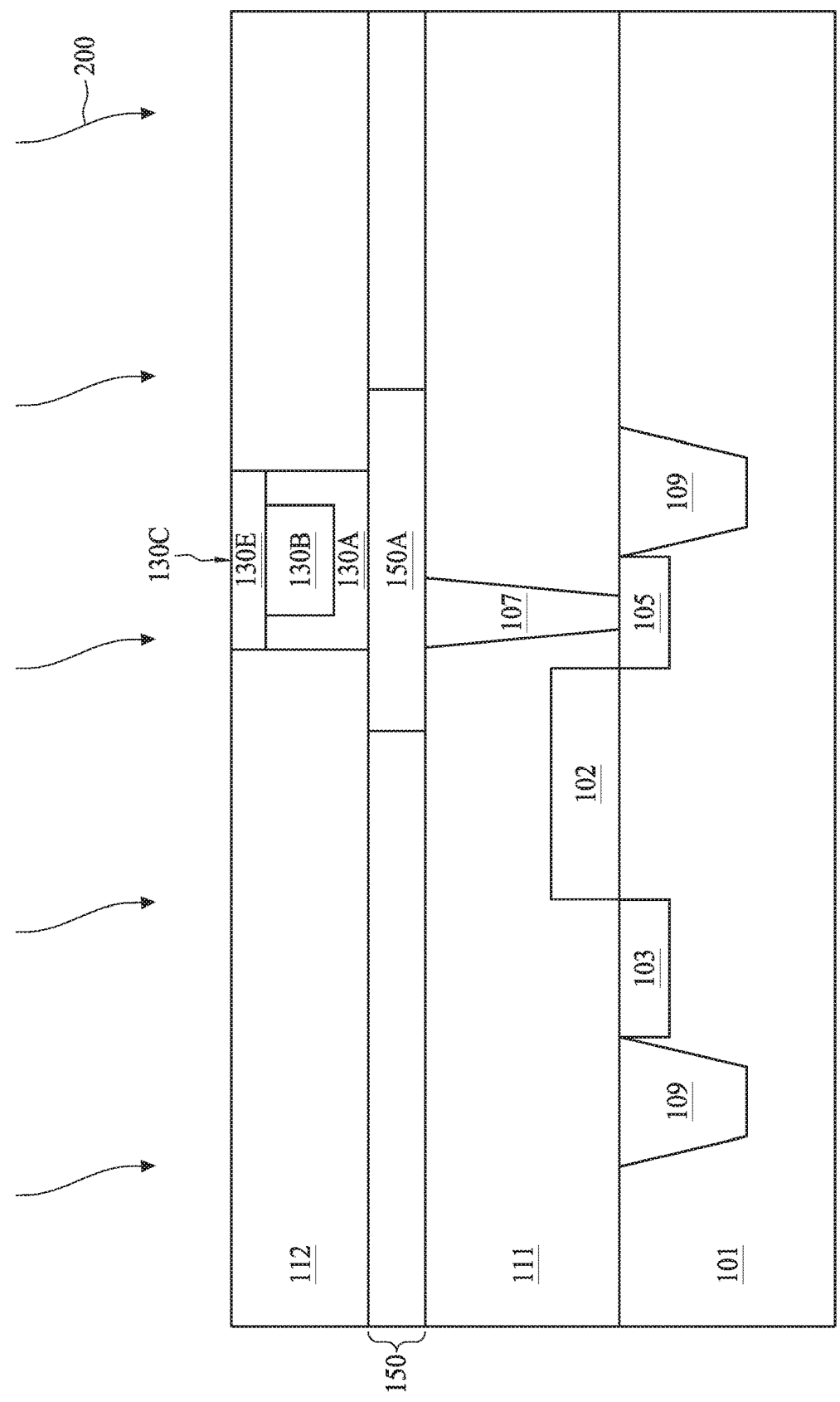
Figure 21:
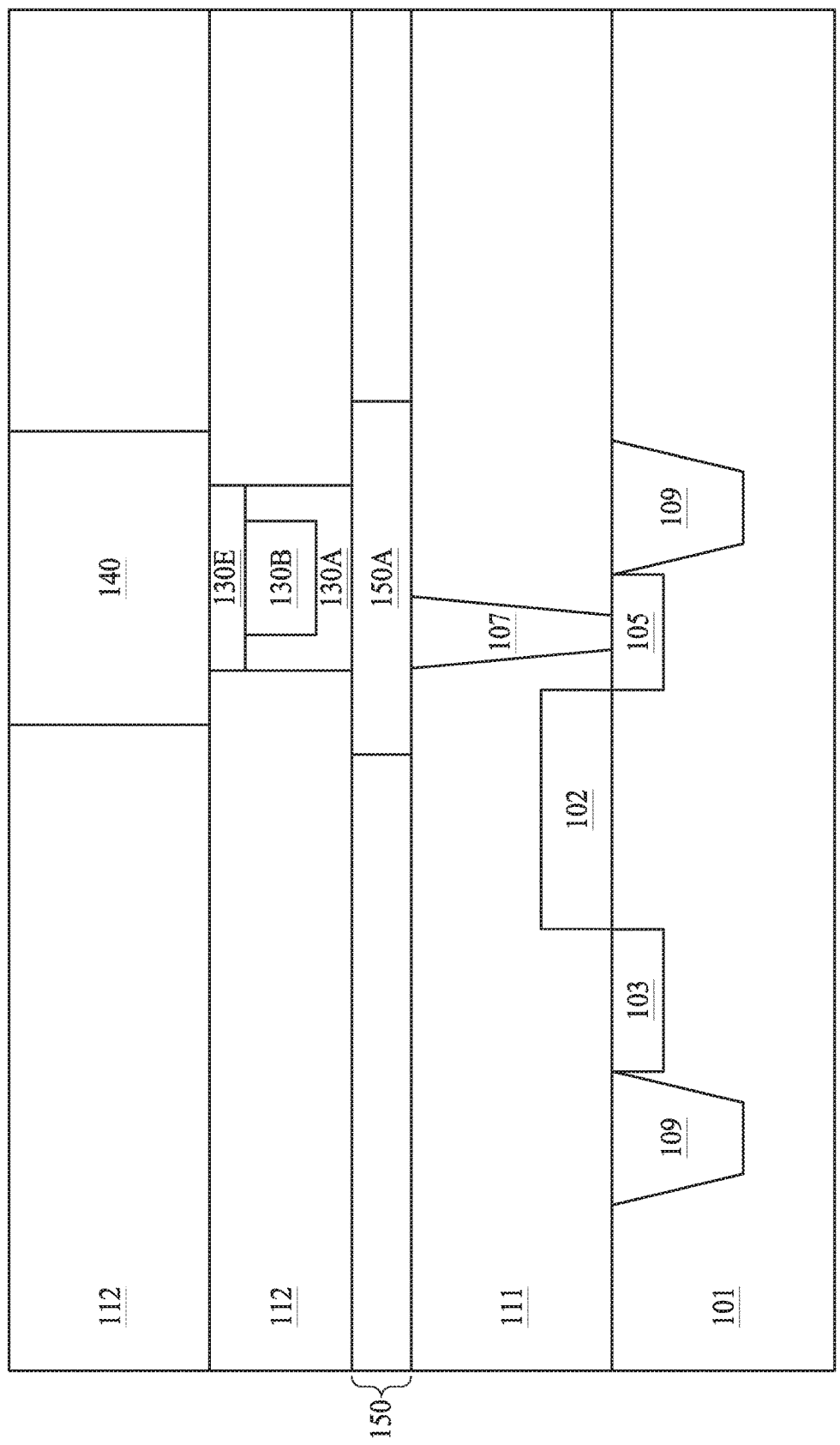

Two subsequent operations can follow the operation illustrated in FIG. 19, that is, FIG. 20A and FIG. 20B. If FIG. 20A is chosen, a phase change material 140 is formed over and in contact with the first surface 130C. The phase change material 140 may be formed using well-known single damascene process by forming an opening with a predetermined width W2 in the middle ILD 112, filling the opening with phase change material 140, and removing excess phase change material 140. Phase change material 140 may include commonly used chalcogenide materials including, but not limited to, one or more of Ge, Te, and Sb, e.g., which may be GeSbTe, NGeSbTe, InGeSbTe or stoichiometric materials. If FIG. 20B is chosen, an oxygen treatment 200 is performed over the first surface 130C before the formation of the phase change material 140 over the first surface 130C, as illustrated in FIG. 21.

The oxygen treatment 200 illustrated in FIG. 20B is applied to the coplanar surface or the first surface 130C composed of at least the heat conducting core 130B and the heat isolation shell 130A. In some embodiments, the oxygen treatment 200 may include a plasma oxidation using atomic oxygen generated in a plasma. In one embodiment, oxidizing with a plasma can be accomplished with atomic oxygen generated in a Krypton/oxygen plasma. Alternately, the plasma can be generated using helium. In one embodiment, prior to the plasma oxidation process, oxygen is supplied during the planarization operation to provide a small seed amount of oxygen into the film prior to oxidation. This initial supply of oxygen is provided using an ionizer ring. The mixed plasma process generates atomic oxygen or oxygen radicals in contrast to molecular oxygen or $O_2$ used in conventional thermal oxidation. The atomic oxygen is introduced to the heat conducting core 130B and the heat isolation shell 130A from the exposed first surface 130C, creating an oxide portion. The atomic oxygen continues to react with the layer and creates an oxidation interface. As the reaction progresses, atomic oxygen diffuses through the oxide portion and reacts at the oxidation interface until a desired thickness of heat assisting layer 130E is formed.

In some embodiments, the oxygen treatment 200 may include a rapid thermal annealing (RTA) operation which is carried out in an oxidizing ambient such as oxygen, NO, $N_2O$, $NH_3$ and other like oxidizing ambient. Combinations of these oxidizing ambient are also contemplated herein. The oxidizing ambient or combination thereof may also be used in conjunction with a carrier gas (or mixture of carrier gases) such as helium, argon, nitrogen or other like inert carrier gases. Combinations of the above rapid thermal processes such as RTA, rapid thermal nitridation (RTN), and rapid thermal oxynitridation (RTON) are also contemplated herein. The RTA, RTN or RTON operations are carried out at a temperature of about 400° C. or above and for a time period of from about 180 seconds or less. More specifically, the RTA, RTN or RTON operations are carried out at a temperature of from about 600° to about 900° C. for a time period of from about 5 to about 60 seconds. Other temperatures and times that are capable of forming an interfacial oxide, oxynitride and/or nitride layer on a surface of heat conducting core 130B and the heat isolation shell 130A can also be used in the RTA, RTN or RTON operations. The RTO, RTON or RTN process is carried out in a motionless chamber, or in a chamber in which rotation of the substrate is possible. Chamber rotation is preferred in the present invention since it aids in improving growth rate uniformity of the heat assisting layer 130E.

The heat assisting layer 130E formed using oxygen plasma operation may have a thinner surface oxide/oxynitride compared to the one formed using RTA, RTN, RTON operations. In some embodiments, oxygen plasma operation has a better thickness control of the heat assisting layer 130E than the rapid thermal annealing operations.

Some embodiments provide a phase change memory structure, including a transistor region, a phase change material over the transistor region, a heater over the transistor region and in contact with the phase change material, and a dielectric layer surrounding the heater and the phase change material. The heater includes a first material having a first thermal conductivity, the first material disposed at a periphery of the heater, and a second material having a second thermal conductivity greater than the first thermal conductivity, the second material disposed at a center of the heater.

Some embodiments provide a semiconductor device, including a transistor, a first metallization layer over the transistor, a phase change material over the first metallization layer, a second metallization layer over the phase change material, a dielectric layer between the first metallization layer and the second metallization layer, surrounding the phase change material, and a heater in the dielectric layer and in contact with the phase change material. The heater includes a heat insulation shell and a heat conducting core, the heat insulation shell obstructing heat dissipation from the heat conducting core.

Some embodiments provide a method for manufacturing a phase change memory structure, the method includes forming a bottom electrode, forming a dielectric layer over the bottom electrode, the dielectric layer patterned with a contact trench, depositing a heat insulation layer having an effective first thermal conductivity in a sidewall and a bottom of the contact trench, filling the contact trench with a heat conductive material having a second thermal conductivity greater than the effective first thermal conductivity, planarizing the first material, the second material, and the dielectric layer to form a coplanar surface of the first material, the second material, and the dielectric layer, and forming a phase change material over and in contact with the coplanar surface.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A phase change memory structure, comprising:
a transistor region;
a phase change material over the transistor region;
a heater over the transistor region and in contact with the phase change material, the heater comprising:
a first material having a first thermal conductivity, the first material disposed at a periphery of the heater; and
a second material having a second thermal conductivity greater than the first thermal conductivity, the second material disposed at a center of the heater; and
a dielectric layer surrounding the heater and the phase change material,
wherein the phase change material is in direct contact with the second material.

2. The phase change memory structure of claim 1, wherein the heater is in contact with the phase change material at a first surface comprising the first material and the second material.

3. The phase change memory structure of claim 2, the heater further comprising a second surface opposite to the first surface, the second surface comprising only the first material.

4. The phase change memory structure of claim 1, the heater further comprising a third material having a third thermal conductivity lower than the second thermal conductivity, the third material being in contact with the phase change material.

5. The phase change memory structure of claim 4, wherein the third material comprises graded oxygen derivatives of the first material and the second material.

6. The phase change memory structure of claim 1, further comprising a fourth material having a fourth thermal conductivity, disposed between the first material and the second material.

7. The phase change memory structure of claim 6, wherein the first material and the fourth material comprise a superlattice structure.

8. The phase change memory structure of claim 1, wherein the heater is a bottom electrode.

9. The phase change memory structure of claim 1, wherein the heater is a top electrode.

10. The phase change memory structure of claim 1, wherein the heater is a bottom electrode contact.

11. A semiconductor device, comprising:
   a transistor;
   a first metallization layer over the transistor;
   a phase change material over the first metallization layer;
   a second metallization layer over the phase change material;
   a dielectric layer between the first metallization layer and the second metallization layer, surrounding the phase change material; and
   a heater in the dielectric layer and in contact with the phase change material; and
   wherein the heater comprises a heat insulation shell and a heat conducting core, the heat insulation shell obstructing heat dissipation from the heat conducting core.

12. The semiconductor device of claim 11, wherein the heat insulation shell and the heat conducting core are both in contact with the phase change material.

13. The semiconductor device of claim 11, wherein the first metallization layer comprises a bottom electrode for the phase change material and the heater is a contact extending from the bottom electrode to a bottom of the phase change material.

14. The semiconductor device of claim 13, further comprising a top electrode in contact with the phase change material and being surrounded by the dielectric layer.

15. The semiconductor device of claim 13, wherein the second metallization layer comprises a top electrode in contact with the phase change material.

16. The semiconductor device of claim 11, wherein a portion of the heat insulation shell in contact with the phase change material comprises oxynitrides.

17. The semiconductor device of claim 11, wherein the heat insulation shell comprises superlattice structure.

18. A method for manufacturing a phase change memory structure, comprising:
   forming a bottom electrode;
   forming a dielectric layer over the bottom electrode, the dielectric layer patterned with a contact trench;
   depositing a heat insulation layer having an effective first thermal conductivity in a sidewall and a bottom of the contact trench;
   filling the contact trench with a heat conductive material having a second thermal conductivity greater than the effective first thermal conductivity;
   planarizing the first material, the second material, and the dielectric layer to form a coplanar surface of the first material, the second material, and the dielectric layer;
   oxidizing the coplanar surface to obtain oxygen derivatives of the first material and the second material before forming the phase change material; and
   forming a phase change material over and in contact with the coplanar surface.

19. The method of claim 18, wherein the depositing the heat insulation layer comprises forming a superlattice structure.

20. The method of claim 18, wherein forming the bottom electrode comprises forming a first metallization layer.

* * * * *